(12) United States Patent
Shimizu et al.

(10) Patent No.: US 10,636,866 B2
(45) Date of Patent: Apr. 28, 2020

(54) CAPACITOR, METHOD FOR MANUFACTURING SAME, AND WIRELESS COMMUNICATION DEVICE USING SAME

(71) Applicant: TORAY INDUSTRIES, INC., Tokyo (JP)

(72) Inventors: Hiroji Shimizu, Otsu (JP); Junji Wakita, Otsu (JP); Seiichiro Murase, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/764,197

(22) PCT Filed: Oct. 14, 2016

(86) PCT No.: PCT/JP2016/080554
§ 371 (c)(1),
(2) Date: Mar. 28, 2018

(87) PCT Pub. No.: WO2017/069059
PCT Pub. Date: Apr. 27, 2017

(65) Prior Publication Data
US 2018/0277619 A1  Sep. 27, 2018

(30) Foreign Application Priority Data

Oct. 21, 2015  (JP) ................. 2015-206916

(51) Int. Cl.
*H01L 49/02* (2006.01)
*H01G 4/33* (2006.01)
(Continued)

(52) U.S. Cl.
CPC .......... *H01L 28/40* (2013.01); *G06K 19/0775* (2013.01); *H01G 4/008* (2013.01);
(Continued)

(58) Field of Classification Search
CPC ................. H01L 28/40; H01L 21/0274; H01L 21/02118; H01L 21/288; H01L 27/0629;
(Continued)

(56) References Cited

U.S. PATENT DOCUMENTS 5,805,409 A * 9/1998 Takahara ............. H01G 4/2325
361/301.4
2005/0221101 A1* 10/2005 Yamada .................. B32B 15/08
428/458
(Continued)

FOREIGN PATENT DOCUMENTS

JP      10-112216 A    4/1998
JP      10112216 A *   4/1998
(Continued)

OTHER PUBLICATIONS

International Search Report, issued in PCT/JP2016/080554, PCT/ISA/210, dated Dec. 27, 2016.
(Continued)

*Primary Examiner* — Steven H Loke
*Assistant Examiner* — Juanita B Rhodes
(74) *Attorney, Agent, or Firm* — Birch, Stewart, Kolasch & Birch, LLP

(57) ABSTRACT

Provided is a capacitor that has good bonding between the dielectric layer and the conductive layer, has a characteristic of low ESR, and keeps leak current suppressed. The capacitor contains a dielectric layer and a conductive film and is characterized in that the dielectric layer contains an organic compound and a metal compound and that the conductive film contains a conductive material and an organic compound.

14 Claims, 4 Drawing Sheets

(51) Int. Cl.
*H01G 4/20* (2006.01)
*H01G 4/40* (2006.01)
*H01G 4/008* (2006.01)
*G06K 19/077* (2006.01)
*H01L 21/84* (2006.01)
*H01G 4/14* (2006.01)
*H01G 4/10* (2006.01)
*H01L 21/027* (2006.01)
*H01G 4/18* (2006.01)
*H01L 21/02* (2006.01)
*H01L 21/288* (2006.01)
*H01L 27/06* (2006.01)
*H01L 27/12* (2006.01)

(52) U.S. Cl.
CPC ............... *H01G 4/18* (2013.01); *H01G 4/206* (2013.01); *H01G 4/33* (2013.01); *H01G 4/40* (2013.01); *H01L 21/0274* (2013.01); *H01L 21/02118* (2013.01); *H01L 21/02126* (2013.01); *H01L 21/02145* (2013.01); *H01L 21/02153* (2013.01); *H01L 21/02216* (2013.01); *H01L 21/02282* (2013.01); *H01L 21/288* (2013.01); *H01L 21/84* (2013.01); *H01L 27/0629* (2013.01); *H01L 27/1203* (2013.01)

(58) Field of Classification Search
CPC ........... H01L 21/02282; H01L 27/1203; H01L 21/84; H01L 21/02216; H01L 21/02126; H01L 21/02153; H01L 21/02145; H01G 4/206; H01G 4/40; H01G 4/008; H01G 4/18; H01G 4/33; H01G 4/14; H01G 4/10; G06K 19/0775; G06K 19/07; G06K 19/077

See application file for complete search history.

(56) References Cited

U.S. PATENT DOCUMENTS

2011/0089419 A1* 4/2011 Yamazaki ........... H01L 27/1112
257/43
2018/0148574 A1* 5/2018 Okamura ................ H02P 27/06

FOREIGN PATENT DOCUMENTS

| JP | 2006-309202 A | 11/2006 | |
|---|---|---|---|
| JP | 2008-112147 A | 5/2008 | |
| WO | WO-2010114301 A2 * | 10/2010 | ............... H01G 4/33 |
| WO | WO-2014142105 A1 * | 9/2014 | ............... H01B 3/46 |

OTHER PUBLICATIONS

Written Opinion of the International Searching Authority, issued in PCT/JP2016/080554, PCT/ISA/237, dated Dec. 27, 2016.

* cited by examiner

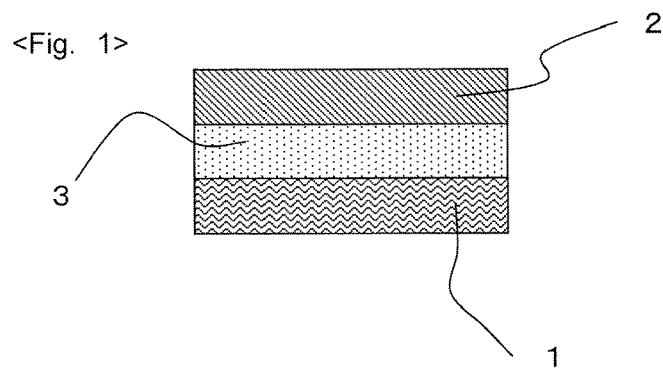
<Fig. 1>
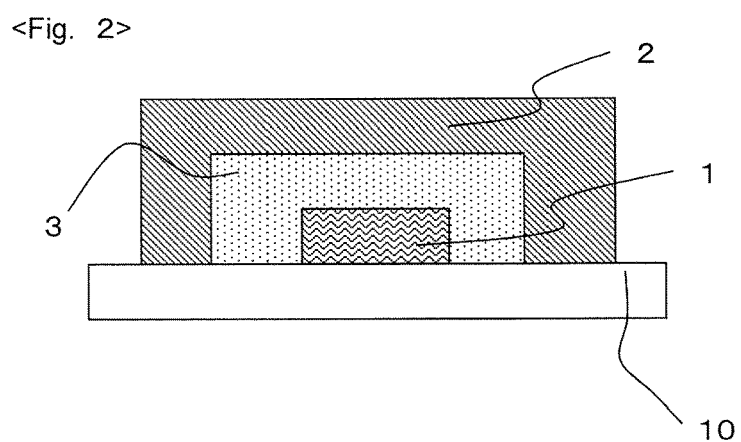
<Fig. 2>
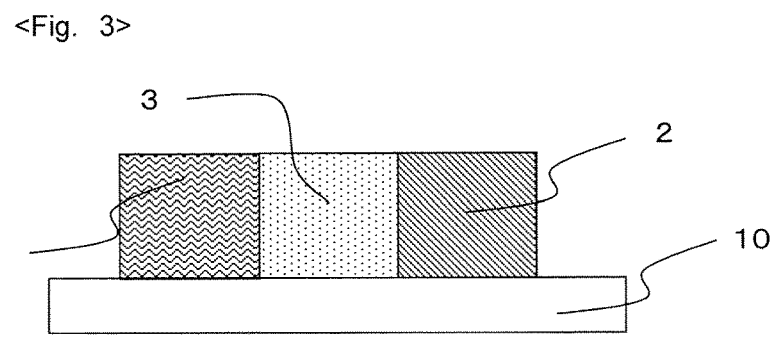
<Fig. 3>
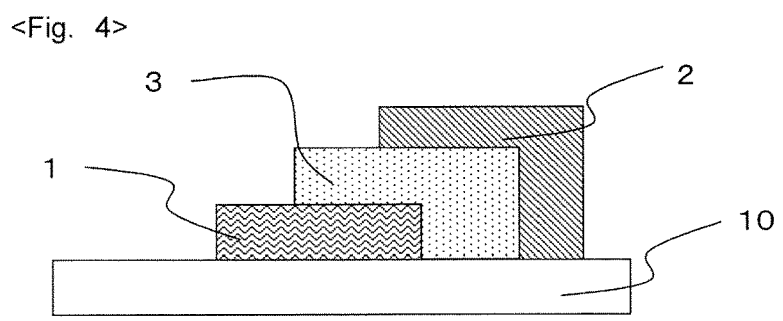
<Fig. 4>

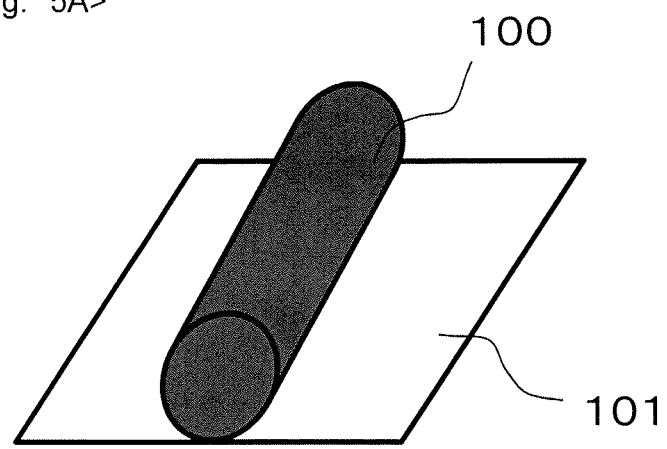
<Fig. 5A>
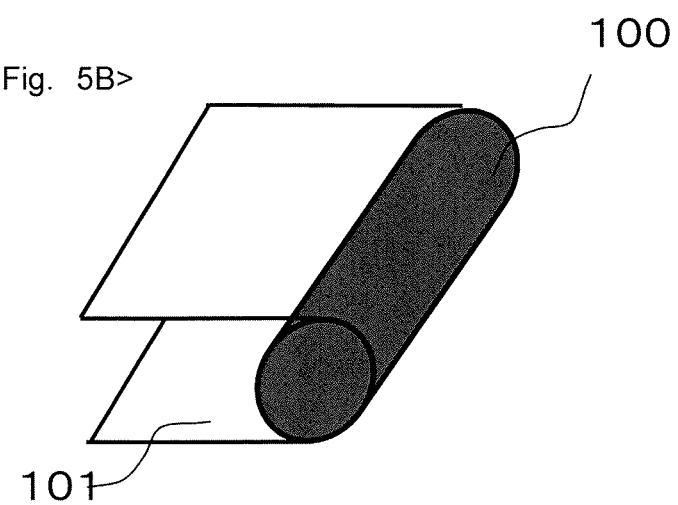
<Fig. 5B>

CAPACITOR, METHOD FOR MANUFACTURING SAME, AND WIRELESS COMMUNICATION DEVICE USING SAME

TECHNICAL FIELD

The present invention relates to a capacitor, a method of producing the same, and a radio communication device using the same.

BACKGROUND ART

In recent years, development has been promoted for radio communication systems using RFID (Radio Frequency IDentification) technology for contactless tags. RFID systems perform radio communication between a radio transceiver called a reader/writer and an RFID tag.

RFID tags are expected to be utilized in various applications such as logistics management, merchandise management, shoplifting prevention, and the like, and have started being introduced in some of the applications, for example, merchandise tags and IC cards such as transportation cards. An RFID tag has an IC chip and an antenna for radio communication with readers/writers, and the antenna mounted in the tag receives carrier waves transmitted from readers/writers and thus operates the tag.

RFID tags are expected to be used for every kind of merchandise and are required to provide at low cost. Thus, studies have been made on cost reduction based on getting rid of production processes that use vacuum and high temperature and using coating and printing technologies to produce tags on flexible base materials (see Patent Documents 1 and 2, for example).

CITATION LIST

Patent Documents

Patent Document 1: Japanese National-Phase Publication (JP-A) No. 2011-519147
Patent Document 2: Japanese Patent Application Laid-Open (JP-A) No. 2014-160515

SUMMARY OF INVENTION

Technical Problem

Carrier waves used for transmission and reception between an RFID tag and a reader/writer generally have a frequency of 125 kHz, 13.56 MHz, 920 MHz, 2.45 GHz, and the like. Capacitors included in IC chips in RFID tags need to ensure operation at these high frequencies.

To enhance frequency characteristics, capacitors are required to have a lower Equivalent Series Resistance (hereinafter referred to as ESR). To make ESR lower, it is necessary to increase the dielectric constant of a dielectric layer material for a capacitor or to have good electrical connection between the dielectric layer and the conductive layer. Additionally, if an RFID tag is at a sufficiently short distance from a reader/writer, it causes the receiving electric power of the carrier wave to be higher and thus involves an operational electric strength commensurate therewith. This also requires the dielectric layer of a capacitor to have a certain degree of thickness.

Patent Document 1 discloses a method in which a dielectric material precursor ($SiO_2$ precursor) is deposited to turn into a dielectric layer, on which a metal oxide is then deposited; and a method in which a conductive substrate is oxidized and/or nitrided, thereby forming a dielectric layer of a capacitor. However, the method in which a dielectric material precursor is turned into a dielectric layer on which a metal oxide is then deposited poses a problem in that the adhesiveness between the dielectric layer and the metal oxide layer is poor and that the ESR is high. In addition, there is a problem in that the dielectric layer is thin, hence causing a large leak current.

With attention focused on the above-mentioned problems, an object of the present invention is to provide a capacitor that has good adhesiveness between the dielectric layer and the conductive layer, has a characteristic of low ESR, and keeps leak current suppressed.

Solution to Problem

In other words, the present invention is a capacitor including at least one pair of conductive films and a dielectric layer provided between the pair of conductive films, in which the dielectric layer contains an organic compound and a metal compound, and in which at least one of the pair of conductive films contains a metal and an organic compound.

In addition, the present invention is a method of producing a capacitor, including the following steps.
(1) The step of forming, on an insulated substrate, a photosensitive conductive film using a conductive paste containing an electric conductor and a photosensitive organic compound.
(2) The step of processing the photosensitive conductive film into a pattern corresponding to a conductive film of the capacitor by photolithography.
(3) The step of applying a composition containing an organic compound and a metal compound, and drying the composition to form a dielectric layer.

Advantageous Effects of Invention

The present invention makes it possible to produce, at low cost, a capacitor that has good adhesiveness between the dielectric layer and the conductive film, has a characteristic of low ESR, and keeps leak current suppressed.

BRIEF DESCRIPTION OF DRAWINGS

FIG. 1 is a schematic cross-sectional view depicting an embodiment of a capacitor according to the present invention.
FIG. 2 is a schematic cross-sectional view depicting an embodiment of a capacitor according to the present invention.
FIG. 3 is a schematic cross-sectional view depicting an embodiment of a capacitor according to the present invention.
FIG. 4 is a schematic cross-sectional view depicting an embodiment of a capacitor according to the present invention.
FIG. 5A is a schematic perspective view depicting an antenna substrate being evaluated for flexing resistance.
FIG. 5B is a schematic perspective view depicting an antenna substrate being evaluated for flexing resistance.

DESCRIPTION OF EMBODIMENTS

<Capacitor>

Figure 6:
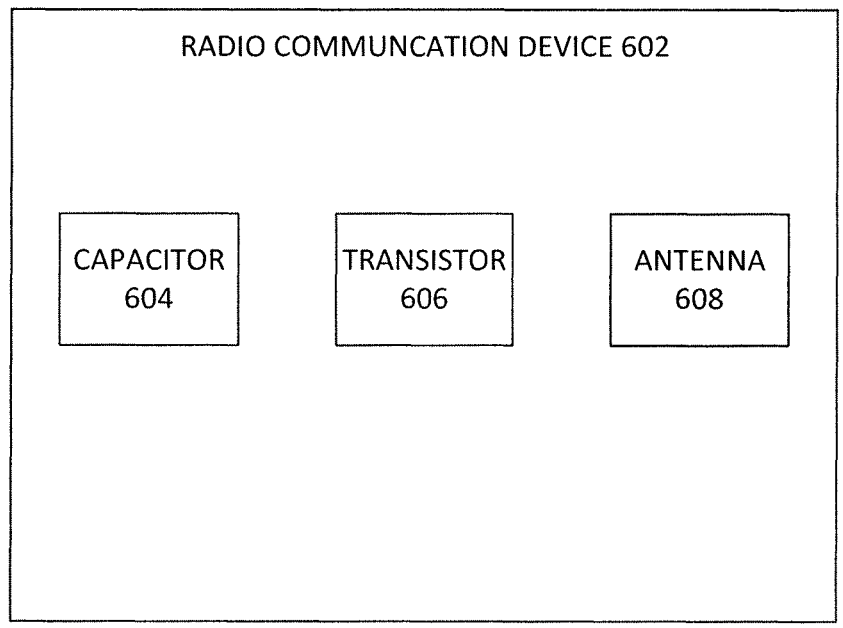
FIG. 6 is a block diagram depicting a radio communication device in accordance with an embodiment of the present disclosure.

A capacitor according to the present invention contains at least a dielectric layer and a conductive film. The capacitor depicted in FIG. 1 is an embodiment of a capacitor according to the present invention, and has one pair of conductive films, i.e. a first conductive film 1 and a second conductive film 2, and a dielectric layer 3. The first conductive film 1 and the second conductive film 2 are not electrically connected, and the dielectric layer 3 is formed between the conductive film 1 and the second conductive film 2.

FIGS. 2, 3, and 4 are schematic cross-sectional views depicting examples of other embodiments of the capacitor according to the present invention. FIG. 2 depicts a substrate 10, on which the conductive film 1 is covered by the dielectric layer 3, which is further covered by the conductive film 2. FIG. 3 depicts the conductive films 1 and 2 formed on same substrate 10 and the dielectric layer 3 is formed between the conductive films. FIG. 4 depicts a substrate 10, on which part of the conductive film 1 is covered by the dielectric layer 3, part of which is further covered by the conductive film 2.

The above-mentioned embodiments are examples of the present invention, which is not to be limited to the embodiments. The below-mentioned description equally applies to all embodiments, unless otherwise specified.

(Dielectric Layer)

The dielectric layer contains an organic compound and a metal compound.

(Organic Compound in Dielectric Layer)

Examples of organic compounds include silane compounds represented by the general formula (3), epoxy-group-containing silane compounds represented by the general formula (4), condensates of these compounds, polysiloxanes in which the compounds are copolymerization components, and the like. Among these, polysiloxanes are more preferable because they have a high dielectric constant and allow low-temperature curing. Among polysiloxanes, those in which a silane compound represented by the general formula (3) or an epoxy-group-containing silane compound represented by the general formula (4) is a copolymerization component are particularly preferable.

$$R^3{}_m Si(OR^4)_{4-m} \quad (3)$$

$R^3$ represents a hydrogen atom, alkyl group, heterocyclic group, aryl group, or alkenyl group, and when a plurality of $R^3$s are present, the $R^3$s may be the same or different. $R^4$ represents a hydrogen atom, alkyl group, acyl group, or aryl group, and when a plurality of $R^4$s are present, the $R^4$s may be the same or different. m represents an integer from 1 to 3.

$$R^5{}_n R^6{}_l Si(OR^7)_{4-n-l} \quad (4)$$

$R^5$ represents an alkyl group having one or more epoxy groups at part of its chain, and when a plurality of $R^5$s are present, the $R^5$s may be the same or different. $R^6$ represents a hydrogen atom, alkyl group, heterocyclic group, aryl group, or alkenyl group, and when a plurality of $R^6$s are present, the $R^6$s may be the same or different. $R^7$ represents a hydrogen atom, alkyl group, acyl group, or aryl group, and when a plurality of $R^7$s are present, the $R^7$s may be the same or different. l is an integer from 0 to 2, and n represents 1 or 2. However, $1+n<3$.

Alkyl groups as $R^3$ to $R^7$ represent, for example, saturated aliphatic hydrocarbon groups such as a methyl group, ethyl group, n-propyl group, isopropyl group, n-butyl group, sec-butyl group, tert-butyl group, cyclopropyl group, cyclohexyl group, norbornyl group, and adamantyl group, and they optionally contain or do not contain a substituent. When they contain a substituent, the additional substituent is not limited to a particular one, and examples thereof include an alkoxy group, aryl group, and the like, which may further have a substituent. In addition, the number of carbon atoms in an alkyl group is not limited to a particular one, but is preferably 1 to 20, more preferably 1 to 8, from the viewpoints of easy availability and cost.

Acyl groups as $R^4$ and $R^7$ represent functional groups in which one of the carbonyl bonds is substituted with an aliphatic hydrocarbon group or an aromatic group, examples of which functional groups include acetyl groups, hexanoyl groups, and benzoyl groups. This aliphatic hydrocarbon group or aromatic group optionally contains or does not contain a substituent. The number of carbon atoms in an acyl group is not limited to a particular one, but is preferably in the range of 2 to 40.

Aryl groups as $R^3$, $R^4$, $R^6$, and $R^7$ represent, for example: aromatic hydrocarbon groups such as a phenyl group, naphthyl group, biphenyl group, anthracenyl group, phenanthryl group, terphenyl group, and pyrenyl group; and aromatic heterocyclic groups such as a furanyl group, thiophenyl group, benzofuranyl group, dibenzofuranyl group, pyridyl group, and quinolinyl group. These groups optionally contain or do not contain a substituent. The number of carbon atoms in an aryl group is not limited to a particular one, but is preferably in the range of 3 to 40.

Heterocyclic groups as $R^3$ and $R^6$ represent groups derived from aliphatic rings having an atom other than carbon in the ring, examples of which aliphatic rings include a pyran ring, piperidine ring, amide ring, and the like. These groups optionally contain or do not contain a substituent. The number of carbon atoms in a heterocyclic group is not limited to a particular one, but is preferably in the range of 2 to 20.

Alkenyl groups as $R^3$ and $R^6$ represent unsaturated aliphatic hydrocarbon groups containing a double bond, examples of which unsaturated aliphatic hydrocarbon groups include a vinyl group, allyl group, butadienyl group, and the like. These groups optionally contain or do not contain a substituent. The number of carbon atoms in an alkenyl group is not limited to a particular one, but is preferably in the range of 2 to 20.

Alkyl groups, as $R^5$, having an epoxy group at part of the chain represent alkyl groups having, at part of the chain, a three-membered ring ether structure formed by two mutually adjacent carbon atoms bound to one oxygen atom. This includes both cases: the case of using two mutually adjacent carbon atoms contained in the main chain which is the longest strand of carbon atoms in an alkyl group; and the case of using two mutually adjacent carbon atoms contained in a part other than the main chain, so-called side chain.

Incorporating, as a copolymerization component of a polysiloxane, a silane compound represented by the general formula (3) enables the formation of a dielectric layer that has a high dielectric constant and high chemical resistance while maintaining high transparency over a visible light region. In addition, having an aryl group as at least one of $R^a$s in the number of m in the general formula (3) is preferable because it allows the dielectric layer to have better flexibility and to be prevented from having cracks occurring thereto.

Specific examples of silane compounds represented by the general formula (3) include vinyltrimethoxysilane, vinyltriethoxysilane, 3-methacryloxypropyltrimethoxysilane, 3-methacryloxypropyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, phenyltriethoxysilane, p-tolyltrimethoxysilane, benzyltrimethoxysilane, α-naphthyltrimethoxysilane, β-naphthyltrimethoxysilane, 3-aminopropyltriethoxysilane, N-(2-aminoethyl)-3-aminopropyltrimethoxysilane, 3-chloropropyltrimethoxysilane, dimethyldimethoxysilane, dimethyldiethoxysilane, diphenyldimethoxysilane, diphenyldiethoxysilane, methylphenyldimethoxysilane, methylvinyldimethoxysilane, methylvinyldiethoxysilane, 3-aminopropylmethyldimethoxysilane, N-(2-aminoethyl)-3-aminopropylmethyldimethoxysilane, 3-chloropropylmethyldimethoxysilane, 3-chloropropylmethyldiethoxysilane, cyclohexylmethyldimethoxysilane, 3-methacryloxypropyldimethoxysilane, octadecylmethyldimethoxysilane, trimethoxysilane, trifluoroethyltrimethoxysilane, trifluoroethyltriethoxysilane, trifluoroethyltriisopropoxysilane, trifluoropropyltrimethoxysilane, trifluoropropyltriethoxysilane, trifluoropropyltriisopropoxysilane, heptadecafluorodecyltrimethoxysilane, heptadecafluorodecyltriethoxysilane, heptadecafluorodecyltriisopropoxysilane, tridecafluorooctyltriethoxysilane, tridecafluorooctyltrimethoxysilane, tridecafluorooctyltriisopropoxysilane, trifluoroethylmethyldimethoxysilane, trifluoroethylmethyldiethoxysilane, trifluoroethylmethyldiisopropoxysilane, trifluoropropylmethyldimethoxysilane, trifluoropropylmethyldiethoxysilane, trifluoropropylmethyldiisopropoxysilane, heptadecafluorodecylmethyldimethoxysilane, heptadecafluorodecylmethyldiethoxysilane, heptadecafluorodecylmethyldiisopropoxysilane, tridecafluorooctylmethyldimethoxysilane, tridecafluorooctylmethyldiethoxysilane, tridecafluorooctylmethyldiisopropoxysilane, trifluoroethylethyldimethoxysilane, trifluoroethylethyldiethoxysilane, trifluoroethylethyldiisopro- poxysilane, trifluoropropylethyldimethoxysilane, trifluoropropylethyldiethoxysilane, trifluoropropylethyldiisopropoxysilane, heptadecafluorodecylethyldimethoxysilane, heptadecafluorodecylethyldiethoxysilane, heptadecafluorodecylethyldiisopropoxysilane, tridecafluorooctylethyldiethoxysilane, tridecafluorooctylethyldimethoxysilane, tridecafluorooctylethyldiisopropoxysilane, p-trifluorophenyltriethoxysilane, and the like.

Among the above-mentioned silane compounds, it is preferable to use vinyltrimethoxysilane, vinyltriethoxysilane, methyltrimethoxysilane, methyltriethoxysilane, ethyltrimethoxysilane, ethyltriethoxysilane, propyltrimethoxysilane, propyltriethoxysilane, hexyltrimethoxysilane, octadecyltrimethoxysilane, octadecyltriethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, trimethoxysilane, and p-trifluorophenyltriethoxysilane, in each of which m is 1, in order to increase cross-linking density and enhance chemical resistance and insulation characteristics.

In addition, from the viewpoint of volume productivity, it is particularly preferable to use vinyltrimethoxysilane, methyltrimethoxysilane, ethyltrimethoxysilane, propyltrimethoxysilane, hexyltrimethoxysilane, octadecyltrimethoxysilane, phenyltrimethoxysilane, p-tolyltrimethoxysilane, benzyltrimethoxysilane, α-naphthyltrimethoxysilane, β-naphthyltrimethoxysilane, trifluoroethyltrimethoxysilane, and trimethoxysilane, in each of which $R^2$ is a methyl group.

In addition, it is preferable to combine two or more of the silane compounds represented by the general formula (3).

Among others, it is particularly preferable to combine a silane compound having an alkyl group and a silane compound having an aryl group because the combination can achieve both a high dielectric constant and flexibility for preventing cracks.

Incorporating, as a copolymerization component of a polysiloxane, an epoxy-group-containing silane compound represented by the general formula (4) can afford good properties for a dielectric layer to be coated with a resist and a conductive film.

Specific examples of epoxy-group-containing silane compounds represented by the general formula (4) include γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane, γ-glycidoxypropylmethyldimethoxysilane, β-(3,4-epoxycyclohexyl)ethylmethyldimethoxysilane, γglycidoxypropylmethyldiethoxysilane, β-(3,4-epoxycyclohexyl)ethylmethyldiethoxy lane, γ-glycidoxypropylmethyldiisopropoxysilane, β-(3,4-epoxycyclohexyl)ethylmethyldiisopropoxysilane, γ-glycidoxypropylethyldimethoxysilane, β-(3,4-epoxycyclohexyl)ethylethyldimethoxysilane, γ-glycidoxypropylethyldiethoxysilane, β-(3,4-epoxycyclohexyeethylethyldiethoxysilane, γ-glycidoxypropylethyldiisopropoxysilane, β-(3,4-epoxycyclohexyl)ethylethyldiisopropoxysilane, β-(3,4-epoxycyclohexyl)propyltrimethoxysilane, γ-glycidoxyethyltrimethoxysilane, and the like.

Among these, it is preferable to use γ-glycidoxypropyltrimethoxysilane, β-(3,4-epoxycyclohexyl)ethyltrimethoxysilane, γ-glycidoxypropyltriethoxysilane, β-(3,4-epoxycyclohexyl)ethyltriethoxysilane, γ-glycidoxypropyltriisopropoxysilane, β-(3,4-epoxycyclohexyl)ethyltriisopropoxysilane, β-(3,4-epoxycyclohexyl)propyltrimethoxysilane, and γ-glycidoxyethyltrimethoxysilane, in each of which n is equal to 1 and 1 is equal to 0, in order to increase cross-linking density and enhance chemical resistance and a dielectric constant. In addition, it is particularly preferable from the viewpoint of volume productivity to use γ-glycidoxypropyltrimethoxysilane, β-(3,4-epoxycyclohexyl)ethyltrimethoxysilane, β-(3,4-epoxycyclohexyl)propyltrimethoxysilane, γ-glycidoxyethyltrimethoxysilane, in each of which $R^7$ is a methyl group.

The polysiloxane may contain another silane compound as a copolymerization component besides the silane compounds represented by the general formulae (3) and (4). Examples of other silane compounds include diethoxydimethylsilane, diethoxydiphenylsilane, tetramethoxysilane, tetraethoxysilane, and the like.

(Metal Compound in Dielectric Layer)

Examples of metal compounds include, without particular limitation, metal oxides, metal hydroxides, metal chelate compounds, and the like. Examples of metal atoms contained in the metal compounds include magnesium, aluminum, titanium, chromium, manganese, cobalt, nickel, copper, zinc, gallium, zirconium, ruthenium, palladium, indium, hafnium, platinum, and the like, and those which form metal chelate are preferable. Among others, aluminum is preferable from the viewpoints of easy availability, cost, and the stability of metal chelate. Containing such compounds enables the formation of a dielectric layer having a high dielectric constant and a capacitor having low ESR. ESR is preferably 10Ω or less, more preferably 5Ω or less.

The dielectric layer preferably contains 10 to 180 parts by weight of the metal atoms with respect to 100 parts by weight of the total of carbon atoms and silicon atoms. In other words, the weight of the metal atoms is preferably 10 to 180 assuming that the total weight of carbon atoms and silicon atoms is 100. This range can afford a capacitor whose leak current is more suppressed. In this regard, the leak current is preferably less than 10 μA. In addition, a more preferable range for increasing the effect further is a range of 10 to 60 parts by weight of the metal atoms with respect to 100 parts by weight of the total of carbon atoms and silicon atoms, and a further preferable range is a range of 17 to 45 parts by weight of the metal atoms with respect to 100 parts by weight of the total of carbon atoms and silicon atoms.

The weight ratio of the metal atoms with respect to 100 parts by weight of the total of carbon atoms and silicon atoms in a dielectric layer can be determined by using X-ray photoelectron spectroscopy (XPS) to analyze the ratios of elements contained in the dielectric layer, calculating the weight ratio of each element from the obtained element ratios, and finding the weight of metal atoms contained with respect to the total of silicon atoms and carbon atoms as 100 parts by weight.

The dielectric layer preferably has a film thickness of 0.1 to 5 μm. A film thickness in this range makes it easy to form a uniform film and can afford a capacitor having high operational electric strength. The film thicknesses are values measured using a surface texture measuring instrument (Surfcom 1400 made by Tokyo Seimitsu Co., Ltd.).

(Method of Producing Dielectric Layer)

A method of producing such a dielectric layer as abovementioned is not limited to a particular one, and a dielectric layer can be formed by applying a composition containing an organic compound and a metal compound, drying the composition, and heat-treating the obtained coating film if necessary.

Whether the composition contains an organic compound and a metal compound or not can be determined using various organic and inorganic analytical techniques singly or a combination of more than one of the techniques, such as elemental analysis, nuclear magnetic resonance spectrometry, infrared spectroscopic analysis, and X-ray photoelectron spectroscopy.

Examples of methods of forming a dielectric layer include known coating methods such as a spin coating method, a blade coating method, a slit die coating method, a screen printing method, a bar coater method, a casting method, a transfer printing method, an immersion and withdrawal method, an inkjet method, and the like. A known photolithographic method or the like can also be used to form a pattern having a desired shape. Temperatures at which coating films are heat-treated are preferably in the range of 50 to 300° C.

A dielectric layer can be formed, for example, using a composition containing a polymer having a weight-average molecular weight of 1000 or more and a solvent.

This weight-average molecular weight (Mw) is a value determined in terms of polystyrene using GPC (GEL PERMEATION CHROMATOGRAPHY: HLC-8220GPC made by Tosoh Corporation) (developing solvent: tetrahydrofuran, developing rate: 0.4 ml/min.) after filtering a sample through a membrane filter having a pore size of 0.45 μm.

The Mw is preferably 3000 or more, further preferably 5000 or more, from the viewpoint of facilitating filmforming. A larger Mw is preferable because it affords more good film-forming properties. However, too large an Mw will arouse concern that filter permeability in a coating process will deteriorate. Accordingly, the Mw is preferably 20000 or less, further preferably 10000 or less.

(Polymer Having Weight-Average Molecular Weight of 1000 or More)

Polymers having a weight-average molecular weight of 1000 or more preferably have, in their repeating unit, at least one group selected from the group consisting of a hydroxyl group, silanol group, carboxyl group, amino group, and mercapto group. These functional groups react with the metal chelate in the heat-curing of the composition, and hence enable the formation of a rigid film whose leak current is suppressed and which also has excellent solvent resistance. Among these, polysiloxanes are more preferable because they have high insulation properties and allow low-temperature curing. Among polysiloxanes, those whose copolymerization components are a silane compound represented by the general formula (3) and an epoxy-group-containing silane compound represented by the general formula (4) are particularly preferable.

Polysiloxanes can be obtained, for example, by the following method. In a solvent, the compounds all of which are silane compounds containing an epoxy-group-containing silane compound are dissolved, and to this, an acid catalyst and water are added over 1 to 180 minutes, followed by hydrolysis reaction at room temperature to 80° C. for 1 to 180 minutes. A temperature in hydrolysis reaction is more preferably room temperature to 55° C. This reaction solution is heated at 50° C. or more but a temperature equal to or lower than the boiling point of the solvent for 1 to 100 hours to allow condensation reaction, so that an epoxy-groupcontaining polysiloxane can be obtained. In this case, water is added to the epoxy group of the epoxy-group-containing silane compound represented by the general formula (4) so that a diol can be formed, and accordingly, it is necessary to add an amount of water equivalent to or more than that of the epoxy groups in addition to an amount of water equivalent to that of the alkoxyl groups in all silane compounds.

(Solvent)

Specific examples of solvents include, without particular limitation: ethers such as ethylene glycol monomethyl ether, ethylene glycol monoethyl ether, propylene glycol monomethyl ether, propylene glycol monoethyl ether, propylene glycol mono-n-butyl ether, propylene glycol mono-t-butyl ether, ethylene glycol dimethyl ether, ethylene glycol diethyl ether, ethylene glycol dibutyl ether, diethylene glycol ethylmethyl ether, and the like; acetates such as ethylene glycol monoethyl ether acetate, propylene glycol monomethyl ether acetate, propyl acetate, butyl acetate, isobutyl acetate, 3-methoxybutyl acetate, 3-methyl-3-methoxybutyl acetate, methyl lactate, ethyl lactate, butyl lactate, and the like; ketones such as acetyl acetone, methylpropyl ketone, methylbutyl ketone, methylisobutyl ketone, cyclopentanone, 2-heptanone, and the like; alcohols such as butyl alcohol, isobutyl alcohol, pentanol, 4-methyl-2-pentanol, 3-methyl-2-butanol, 3-methyl-3-methoxy butanol, diacetone alcohol, and the like; aromatic hydrocarbons such as toluene, xylene, and the like. These solvents may be used singly or in combination of two or more kinds thereof.

(Metal Chelate)

Preferably, the composition used in the present invention further contains a metal chelate represented by the general formula (1).

$$R^1{}_xM(OR^2)_{y-x} \qquad (1)$$

$R^1$ represents a monovalent bidentate ligand, and when a plurality of $R^1$s are present, the $R^1$s may be the same or different. $R^2$ represents hydrogen, an alkyl group, acyl group, or aryl group, and when a plurality of $R^2$s are present, the R²s may be the same or different. M represents a y-valent metal atom. y is 1 to 6. x represents an integer from 1 to y.

A monovalent bidentate ligand represented by R¹ refers to a compound having a covalently bound group and a coordinated group, one each, on a metal for coordination. Examples of groups to be covalently bound include groups that are enabled by deprotonation to be covalently bound to a metal atom, such as hydroxyl groups, mercapto groups, and carboxyl groups. Examples of groups to be coordinated include carbonyl groups, thiocarbonyl groups, nitrile groups, amino groups, imino groups, phosphine oxide groups, and the like. The number of carbon atoms in R¹ is not limited to a particular one, but is preferably 3 to 20, more preferably 3 to 12, from the viewpoint of pyrolytic properties in film-forming.

Alkyl groups as R² represent, for example, saturated aliphatic hydrocarbon groups such as a methyl group, ethyl group, n-propyl group, isopropyl group, n-butyl group, sec-butyl group, tert-butyl group, cyclopropyl group, cyclohexyl group, norbornyl group, and adamantyl group, and they optionally contain or do not contain a substituent. When they contain a substituent, the additional substituent is not limited to a particular one, and examples thereof include alkoxy groups, aryl groups, and the like, which may further have a substituent. In addition, the number of carbon atoms in an alkyl group is not limited to a particular one, but is preferably 1 to 20, more preferably 1 to 8, from the viewpoints of easy availability and cost.

Acyl groups as R² represent functional groups in which one of the carbonyl bonds is substituted with an aliphatic hydrocarbon group or an aromatic group, examples of which functional groups include acetyl groups, hexanoyl groups, and benzoyl groups, and the aliphatic hydrocarbon group or the aromatic group optionally contains or does not contain a substituent. The number of carbon atoms in an acyl group is not limited to a particular one, but is preferably in the range of 2 to 40.

Aryl groups as R² represent, for example: aromatic hydrocarbon groups such as a phenyl group, naphthyl group, biphenyl group, anthracenyl group, phenanthryl group, terphenyl group, and pyrenyl group; and aromatic heterocyclic groups such as a furanyl group, thiophenyl group, benzofuranyl group, dibenzofuranyl group, pyridyl group, and quinolinyl group; and these optionally contain or do not contain a substituent. The number of carbon atoms in an aryl group is not limited to a particular one, but is preferably in the range of 3 to 40.

Alkoxy groups above-mentioned as substituents represent functional groups in which one of the ether bonds is substituted with an aliphatic hydrocarbon group, examples of which functional groups include methoxy groups, ethoxy groups, and propoxy groups, and the aliphatic hydrocarbon group optionally contains or does not contain a substituent. The number of carbon atoms in an alkoxy group is not limited to a particular one, but is preferably in the range of 1 to 20.

Examples of y-valent metal atoms include magnesium, aluminum, titanium, chromium, manganese, cobalt, nickel, copper, zinc, gallium, zirconium, ruthenium, palladium, indium, hafnium, platinum, and the like, but are not limited to particular ones as long as they form metal chelate. y is 1 to 6 and is a value that depends on the kind of a metal atom. Among others, the metal atoms are preferably selected from the group consisting of aluminum, titanium, zirconium, and indium, from the viewpoints of easy availability and cost.

Among metal chelates, aluminum chelates represented by the following general formula (2), which have excellent stability, is preferable.

$$R^1_3Al \tag{2}$$

R¹ is the same as that in the general formula (1), and each of the R¹s may be the same or different to other R¹. In the general formulae (1) and (2), R¹ is preferably a β-diketone derivative or a β-ketoester derivative among others, which is available at low cost and can form stable chelate.

Specific examples of β-diketone derivatives include 2,4-pentanedione, 2,4-hexanedione, 2,4-heptanedione, 3,5-heptanedione, 2,4-octanedione, 3,5-octanedione, 2,4-decanedione, 2,4-dodecanedione, 2,6-dimethyl-3,5-heptanedione, 2,2,6-trimethyl-3,5-heptanedione, 2,2,6,6-tetramethyl-3,5-heptanedione, 2,2,6,6-tetramethyl-3,5-octanedione, 3-methyl-2,4-pentanedione, 3-ethyl-3,5-heptanedione, benzoylacetone, dibenzoylmethane, 1-(pyridyl-2-yl)-1,3-butanedione, 1-(pyridyl-2-yl)-2,5-pentanedione, 1-amino-2,4-pentanedione, and the like.

Specific examples of β-ketoester derivatives include methyl acetoacetate, ethyl acetoacetate, isopropyl acetoacetate, t-butyl acetoacetate, n-butyl acetoacetate, phenyl acetoacetate, ethyl propanoyl acetate, ethyl butanoyl acetate, ethyl pentanoyl acetate, ethyl hexanoyl acetate, ethyl octanoyl acetate, ethyl decanoyl acetate, ethyl dodecanoyl acetate, ethyl-2-methyl propanoyl acetate, ethyl-2,2-dimethyl butanoyl acetate, ethyl benzoyl acetate, ethyl-p-anisoyl acetate, ethyl-2-pyridyloyl acetate, ethyl acrylyl acetate, 1-aminobutanoyl acetate, ethyl-α-acetyl propanate, and the like.

Among aluminum chelates represented by the general formula (2), at least one of the three R's in the general formula (2) is preferably different from the other two, considering the solubility of chelate in a solvent and the stability of the composition. For the same reason, at least one of the R's is preferably a β-ketoester derivative.

Specific examples of metal chelates represented by the general formula (1) as above-mentioned include the following. Examples of aluminum chelates include diethoxy aluminum (2,4-pentanedionate), diisopropoxy aluminum (2,4-pentanedionate), diethoxy aluminum (2,4-hexanedionate), diethoxy aluminum (3,5-hexanedionate), diethoxy aluminum (2,4-octanedionate), diethoxy aluminum benzoyl acetonate, diethoxy aluminum (1-(pyridyl-2-yl)-1,3-butanedionate), diethoxy aluminum methyl acetoacetate, diisopropoxy aluminum methyl acetoacetate, diethoxy aluminum ethyl acetoacetate, diethoxy aluminum isopropyl acetoacetate, diethoxy aluminum-t-butyl acetoacetate, diethoxy aluminum ethylbutanoyl acetate, diethoxy aluminum ethylbenzoyl acetate, ethoxy aluminum bis(2,4-pentanedionate), isopropoxy aluminum bis(2,4-pentanedionate), ethoxy aluminum bis(2,4-hexanedionate), ethoxy aluminum bis(3,5-hexanedionate), ethoxy aluminum bis(2,4-octanedionate), ethoxy aluminum bis(benzoyl acetonate), ethoxy aluminum bis(1-(pyridyl-2-yl)-1,3-butanedionate), ethoxy aluminum bis(ethylacrylyl acetate), ethoxy aluminum bis(methyl acetoacetate), isopropoxy aluminum bis(methyl acetoacetate), ethoxy aluminum bis(ethyl acetoacetate), ethoxy aluminum bis(isopropyl acetoacetate), ethoxy aluminum bis(t-butyl acetoacetate), ethoxy aluminum bis(ethylbutanoyl acetate), ethoxy aluminum bis(ethylbenzoyl acetate), ethoxy aluminum bis(ethylacrylyl acetate), aluminum tris(2,4-pentanedionate), aluminum tris(trifluoro-2,4-pentanedionate), aluminum tris(2,4-hexanedionate), aluminum tris(3,5-hexanedionate), aluminum tris(2,4-octanedionate), aluminum tris(benzoyl acetonate), aluminum tris(1-(pyridine-2- yl)-1,3-butanedionate), aluminum tris(2,6-dimethyl-3,5-heptanedionate), aluminum tris(2,2,6-trimethyl-3,5-heptanedionate), aluminum tris(2,2,6,6-tetramethyl-3,5-octanedionate), aluminum tris(1-amino-2,4-pentanedionate), aluminum tris(methyl acetoacetate), aluminum tris(ethyl acetoacetate), aluminum tris(isopropyl acetoacetate), aluminum tris(t-butyl acetoacetate), aluminum tris(ethylbutanoyl acetate), aluminum tris(ethylpentanoyl acetate), aluminum tris(ethyl-2-methylpropanoyl acetate), aluminum tris(ethylbenzoyl acetate), aluminum tris (ethyl-2-pyridyloyl acetate), aluminum tris(1-aminobutanoyl acetate), aluminum tris(ethyl-α-acetyl propanate), aluminum tris(ethylacrylyl acetate), ethoxy aluminum mono (ethyl acetoacetate)mono(isopropyl acetoacetate), ethoxy aluminum mono(ethyl acetoacetate)mono(3,5-hexanedionate), aluminum bis(ethyl acetoacetate)mono(isopropyl acetoacetate), aluminum bis(ethyl acetoacetate)mono(3,5-hexanedionate), aluminum tris(diethyl malonate), aluminum tris(dioctyl malonate), aluminum tris(diethyl(methyl malonate)), aluminum tris(diethyl(phenyl malonate)), aluminum tris(ethyl thioacetoacetate), aluminum tris(2-acetyl phenolate), aluminum tris(2-(pyridine-2-yl)phenolate), and the like.

Examples of zirconium chelates include trisethoxy zirconium(2,4-pentanedionate), trisisopropoxy zirconium(2,4-pentanedionate), trisethoxy zirconium(2,4-hexanedionate), trisethoxy zirconium(3,5-hexanedionate), trisethoxy zirconium benzoyl acetonate, trisethoxy zirconium methyl acetoacetate, trisisopropoxy zirconium methyl acetoacetate, trisethoxy zirconium ethyl acetoacetate, trisethoxy zirconium isopropyl acetoacetate, trisethoxy zirconium-t-butyl acetoacetate, trisethoxy zirconium ethylbutanoyl acetate, trisethoxy zirconium ethylbenzoyl acetate, diethoxy zirconium bis(2,4-pentanedionate), diisopropoxy zirconium bis (2,4-pentanedionate), diethoxy zirconium bis(2,4-hexanedionate), diethoxy zirconium bis(3,5-hexanedionate), diethoxy zirconium bis(benzoyl acetonate), diethoxy zirconium bis(methyl acetoacetate), diisopropoxy zirconium bis (methyl acetoacetate), diethoxy zirconium bis(ethyl acetoacetate), diethoxy zirconium bis(isopropyl acetoacetate), diethoxy zirconium bis(t-butyl acetoacetate), diethoxy zirconium bis(ethylbutanoyl acetate), diethoxy zirconium bis (ethylbenzoyl acetate), ethoxy zirconium tris(2,4-pentanedionate), isopropoxy zirconium tris(2,4-pentanedionate), ethoxy zirconium tris(2,4-hexanedionate), ethoxy zirconium tris(3,5-hexanedionate), ethoxy zirconium tris(benzoyl acetonate), ethoxy zirconium tris(methyl acetoacetate), isopropoxy zirconium tris(methyl acetoacetate), ethoxy zirconium tris(ethyl acetoacetate), ethoxy zirconium tris(isopropyl acetoacetate), ethoxy zirconium tris(t-butyl acetoacetate), ethoxy zirconium tris(ethylbutanoyl acetate), ethoxy zirconium tris(ethylbenzoyl acetate), zirconium tetrakis(2,4-pentanedionate), zirconium tetrakis (2,4-hexanedionate), zirconium tetrakis(3,5-hexanedionate), zirconium tetrakis(benzoyl acetonate), zirconium tetrakis(2,6-dimethyl-3,5-heptanedionate), zirconium tetrakis(2,2,6-trimethyl-3,5-heptanedionate), zirconium tetrakis(methyl acetoacetate), zirconium tetrakis(ethyl acetoacetate), zirconium tetrakis(isopropyl acetoacetate), zirconium tetrakis(t-butyl acetoacetate), zirconium tetrakis(ethylbutanoyl acetate), zirconium tetrakis(ethyl-2-methyipropanoyl acetate), zirconium tetrakis(ethylbenzoyl acetate), zirconium tetrakis(diethyl malonate), zirconium tetrakis(diethyl (methyl malonate)), ethoxy zirconium bis(ethyl acetoacetate)mono(isopropyl acetoacetate), ethoxy zirconium bis (ethyl acetoacetate)mono(3,5-hexanedionate), zirconium bis (ethyl acetoacetate)bis(isopropyl acetoacetate), zirconium tris(ethyl acetoacetate)mono(3,5-hexanedionate), and the like.

Examples of titanium chelates include trisethoxy titanium (2,4-pentanedionate), trisisopropoxy titanium(2,4-pentanedionate), trisethoxy titanium(2,4-hexanedionate), trisethoxy titanium(3,5-hexanedionate), trisethoxy titanium benzoyl acetonate, trisethoxy titanium methyl acetoacetate, trisisopropoxy titanium methyl acetoacetate, trisethoxy titanium ethyl acetoacetate, trisethoxy titanium isopropyl acetoacetate, trisethoxy titanium t-butyl acetoacetate, trisethoxy titanium ethylbutanoyl acetate, trisethoxy titanium ethylbenzoyl acetate, diethoxy titanium bis(2,4-pentanedionate), diisopropoxy titanium bis(2,4-pentanedionate), diethoxy titanium bis(2,4-hexanedionate), diethoxy titanium bis(3,5-hexanedionate), diethoxy titanium bis(benzoyl acetonate), diethoxy titanium bis(methyl acetoacetate), diisopropoxy titanium bis(methyl acetoacetate), diethoxy titanium bis(ethyl acetoacetate), diethoxy titanium bis(isopropyl acetoacetate), diethoxy titanium bis(t-butyl acetoacetate), diethoxy titanium bis(ethylbutanoyl acetate), diethoxy titanium bis(ethylbenzoyl acetate), ethoxy titanium tris(2,4-pentanedionate), isopropoxy titanium tris(2,4-pentanedionate), ethoxy titanium tris(2,4-hexanedionate), ethoxy titanium tris(3,5-hexanedionate), ethoxy titanium tris(benzoyl acetonate), ethoxy titanium tris(methyl acetoacetate), isopropoxy titanium tris(methyl acetoacetate), ethoxy titanium tris(ethyl acetoacetate), ethoxy titanium tris(isopropyl acetoacetate), ethoxy titanium tris(t-butyl acetoacetate), ethoxy titanium tris(ethylbutanoyl acetate), ethoxy titanium tris(ethylbenzoyl acetate), titanium tetrakis(2,4-pentanedionate), titanium tetrakis(2,4-hexanedionate), titanium tetrakis(3,5-hexanedionate), titanium tetrakis(benzoyl acetonate), titanium tetrakis(2,6-dimethyl-3,5-heptanedionate), titanium tetrakis(2,2,6-trimethyl-3,5-heptanedionate), titanium tetrakis(methyl acetoacetate), titanium tetrakis (ethyl acetoacetate), titanium tetrakis(isopropyl acetoacetate), titanium tetrakis(t-butyl acetoacetate), titanium tetrakis(ethylbutanoyl acetate), titanium tetrakis(ethyl-2-methylpropanoyl acetate), titanium tetrakis(ethylbenzoyl acetate), titanium tetrakis(diethyl malonate), titanium tetrakis(dioctyl malonate), titanium tetrakis(diethyl(methyl malonate)), ethoxy titanium bis(ethyl acetoacetate)mono(3,5-hexanedionate), titanium bis(ethyl acetoacetate)bis(isopropyl acetoacetate), titanium tris(ethyl acetoacetate)mono (3,5-hexanedionate), and the like.

Examples of indium chelates include diethoxy indium(2,4-pentanedionate), diisopropoxy indium(2,4-pentanedionate), diethoxy indium(2,4-hexanedionate), diethoxy indium (3,5-hexanedionate), diethoxy indium benzoyl acetonate, diethoxy indium methyl acetoacetate, diisopropoxy indium methyl acetoacetate, diethoxy indium ethyl acetoacetate, diethoxy indium isopropyl acetoacetate, diethoxy indium t-butyl acetoacetate, diethoxy indium ethylbutanoyl acetate, diethoxy indium ethylbenzoyl acetate, ethoxy indium bis(2,4-pentanedionate), isopropoxy indium bis(2,4-pentanedionate), ethoxy indium bis(2,4-hexanedionate), ethoxy indium bis(3,5-hexanedionate), ethoxy indium bis(benzoyl acetonate), ethoxy indium bis(methyl acetoacetate), isopropoxy indium bis(methyl acetoacetate), ethoxy indium bis(ethyl acetoacetate), ethoxy indium bis(isopropyl acetoacetate), ethoxy indium bis(t-butyl acetoacetate), ethoxy indium bis (ethylbutanoyl acetate), ethoxy indium bis(ethylbenzoyl acetate), indium tris(2,4-pentanedionate), indium tris(2,4-hexanedionate), indium tris(3,5-hexanedionate), indium tris (benzoyl acetonate), indium tris(2,6-dimethyl-3,5-heptanedionate), indium tris(2,2,6-trimethyl-3,5-heptanedionate), indium tris(methyl acetoacetate), indium tris(ethyl acetoacetate), indium tris(isopropyl acetoacetate), indium tris(t-butyl acetoacetate), indium tris(ethylbutanoyl acetate), indium tris(ethyl-2-methylpropanoyl acetate), indium tris (ethylbenzoyl acetate), indium tris(diethyl malonate), indium tris(dioctyl malonate), indium tris(diethyl(methyl malonate)), and the like.

Examples of magnesium chelates include magnesium bis(2,4-pentanedionate), magnesium bis(ethyl acetoacetate), and the like.

Examples of chromium chelates include chromium tris(2,4-pentanedionate), chromium tris(ethyl acetoacetate), and the like.

Examples of manganese chelates include manganese (II) bis(2,4-pentanedionate), manganese (II) bis(ethyl acetoacetate), manganese (III) tris(2,4-pentanedionate), manganese (III) tris(ethyl acetoacetate), and the like.

Examples of cobalt chelates include cobalt tris(2,4-pentanedionate), cobalt tris(ethyl acetoacetate), and the like.

Examples of nickel chelates include nickel bis(2,4-pentanedionate), nickel bis(ethyl acetoacetate), and the like.

Examples of copper chelates include copper bis(2,4-pentanedionate), copper bis(ethyl acetoacetate), and the like.

Examples of zinc chelates include zinc bis(2,4-pentanedionate), zinc bis(ethyl acetoacetate), and the like.

Examples of gallium chelates include gallium tris(2,4-pentanedionate), gallium tris(ethyl acetoacetate), and the like.

Examples of ruthenium chelates include ruthenium tris(2,4-pentanedionate), ruthenium tris(ethyl acetoacetate), and the like.

Examples of palladium chelates include palladium bis(2,4-pentanedionate), palladium bis(ethyl acetoacetate), and the like.

Examples of hafnium chelates include hafnium tetrakis(2,4-pentanedionate), hafnium tetrakis(ethyl acetoacetate), and the like.

Examples of platinum chelates include platinum bis(2,4-pentanedionate), platinum bis(ethyl acetoacetate), and the like.

A metal chelate (a) represented by the general formula (1) can be obtained, for example, by the following method. By dropwise adding a determined amount of ligand into a metal alkoxide and then heating the resulting mixture under reflux to distill an alcohol component derived from the alkoxide, a desired metal chelate can be synthesized. In addition, metal chelates having different ligands can be obtained by dropwise adding two or more kinds of ligands in turns.

The content of (a) a polymer having a weight-average molecular weight of 1000 or more in the composition is preferably in the range of 5 to 90 parts by weight with respect to 100 parts by weight of a metal chelate represented by the general formula (1). A content in this range can ensure good film-forming properties and suppress leak current from a capacitor in which the composition is applied as a dielectric layer.

In addition, when the composition contains a polymer having a weight-average molecular weight of 1000 or more, a solvent, and a metal chelate represented by the general formula (1), and when the composition contains 5 to 90 parts by weight of the polymer having a weight-average molecular weight of 1000 or more with respect to 100 parts by weight of the metal chelate represented by the general formula (1), a gate insulating layer is generally formed from the composition, in which the gate insulating layer contains an organic compound having a bond between silicon and carbon and a metal compound having a bond between a metal atom and an oxygen atom and contains 10 to 180 parts by weight of the metal atoms with respect to 100 parts by weight of the total of carbon atoms and silicon atoms.

Preferably, when the composition contains 10 to 30 parts by weight of the polymer having a weight-average molecular weight of 1000 or more with respect to 100 parts by weight of the metal chelate represented by the general formula (1), a gate insulating layer is generally formed from the composition, in which the gate insulating layer contains an organic compound having a bond between silicon and carbon and a metal compound having a bond between a metal atom and an oxygen atom and contains 17 to 30 parts by weight of the metal atoms with respect to 100 parts by weight of the total of carbon atoms and silicon atoms. In this regard, the relationship between the content ratios of the atoms in the composition and the dielectric layer is a rough tendency, and the above-mentioned relationship is not always satisfied, depending on, for example, the kind of the metal atom and the like.

The composition used in the present invention preferably contains a tetrafunctional silane or a tetrafunctional silane oligomer obtained by the hydrolysis and condensation of a tetrafunctional silane (hereinafter referred to as "tetrafunctional silane or tetrafunctional silane oligomer"). Containing a tetrafunctional silane or tetrafunctional silane oligomer enables the formation of a high density film at lower temperature. Specific examples of tetrafunctional silanes include tetramethoxy silane, tetraethoxy silane, tetraisopropoxy silane, tetra-t-butoxy silane, and the like. Specific examples of tetrafunctional silane oligomers include Methyl Silicate 51, Methyl Silicate 53A, Ethyl Silicate 40, Ethyl Silicate 48, EMS485 (which are tradenames and made by Colcoat Co., Ltd.), M Silicate 51 (which is a tradename and made by Tama Chemicals Co., Ltd.), and the like.

The composition used in the present invention may contain particles. The particles preferably have a particle size of 100 nm or less, further preferably 50 nm or less, from the viewpoint of the evenness of an insulation film. The particle size refers to an average particle size based on the number average, and the average particle size is determined from the specific surface area assuming that the particles are spherical, in which the specific surface area of the particles is measured from the particles obtained when they are dried and then fired. A device to be used is not limited to a particular one, but ASAP 2020 (made by Micromeritics Instrument Corp.) or the like can be used. In addition, the composition is preferably in sol state from the viewpoint of compatibility polysiloxane. Specific examples of (e) particles include silica particles, titania particles, barium titanate particles, zirconia particles, barium sulfate particles, and the like.

The composition used in the present invention can contain a photo acid generator, a sensitizer, a viscosity modifier, a surfactant, a stabilizer, and the like, if necessary.

The dielectric layer may be monolayer or multilayer. In addition, one layer may be formed of a plurality of dielectric material compositions, and a dielectric multilayer may be formed of a plurality of dielectric material compositions that are layered.

(Conductive Film)

In the capacitor according to the present invention, at least one of a pair of conductive films contains an electric conductor and an organic compound. By containing an electric conductor, the conductive film functions as an electrode of the capacitor. By containing an organic compound, the conductive film has higher flexibility and also has good adhesiveness to a dielectric layer even when flexed.

This allows good electric connection and provides a capacitor having a low ESR. From the viewpoint of making the effect even higher, each of the pair of conductive films preferably contains an electric conductor and an organic compound.

The electric conductor may be any conductive material that can be used generally as an electrode. Specific examples include, but are not limited to: conductive metal oxides such as tin oxide, indium oxide, indium tin oxide (ITO), and ruthenium oxide;
metals such as platinum, gold, silver, copper, iron, tin, zinc, aluminum, indium, chromium, lithium, sodium, potassium, cesium, calcium, magnesium, palladium, molybdenum, tungsten, amorphous silicon polysilicon, and alloys thereof;
inorganic conductive compounds such as copper iodide and copper sulfide;
conductive polymers such as polythiophene, polypyrrole, polyaniline, and complexes of polyethylene dioxythiophene and polystyrenesulfonic acid;
carbon; and the like.

It is preferable to enhance the conductivity of the conductive polymers by doping iodine or the like. These electrode materials may be used singly, or a plurality of the materials may be used in layers or in mixture.

In addition, the electric conductor is preferably particles of gold, silver, copper, or platinum from the viewpoint of conductivity. Among others, silver particles are more preferable from the viewpoints of cost and stability. In addition, from the viewpoint of reducing resistivity when the coating film is cured at low temperature, it is further preferable that the electric conductor contain carbon black in addition to the above-mentioned particles.

The electric conductor particles have an average particle size of preferably 0.02 µm to 10 µm, more preferably 0.02 µm to 5 µm, further preferably 0.02 µm to 2 µm. An average particle size of 0.02 µm or more can enhance the probability of contact between particles and reduce the specific resistance value of the produced electrode and the probability of breaking of wiring in the electrode. In addition, an average particle size of 10 µm or less enhances the surface smoothness, pattern accuracy, and dimensional accuracy of the electrode.

In this regard, the average particle size is determined by measuring the sizes of 100 particles and calculating the average value of the measurements, in which the particles are randomly selected on the basis of the images obtained by observing the cross-section of an electrode using a scanning electron microscope (SEM) at a magnification ratio of 10000×. In cases where the shape of particles is spherical, the diameter thereof is regarded as a particle size. In cases where the shape is not spherical, a particle is observed, and the average value of the maximum width and minimum width of the particle is regarded as the particle size thereof.

The content of the electric conductor is preferably within the range of 70 to 95% by weight of the conductive film, more preferably 80 to 90% by weight. A content in this range can enhance the probability of contact between electric conductors particularly in cure shrinkage, and reduce the specific resistance value of the produced conductive film and the probability of breaking of wiring in the film.

Examples of organic compounds include, but are not particularly limited to, photosensitive polymers, photosensitive monomers, photosensitive oligomers, non-photosensitive polymers, non-photosensitive monomers, non-photosensitive oligomers, photopolymerization initiators, plasticizers, leveling agents, surfactants, silane coupling agents, antifoaming agents, pigments, and the like.

Examples of photosensitive organic compounds include photosensitive monomers, photosensitive oligomers, photosensitive polymers, photopolymerization initiator, and the like. Here, the photosensitivity of a photosensitive monomer, photosensitive oligomer, and photosensitive polymer means that when the photosensitive monomer, photosensitive oligomer, or photosensitive polymer is irradiated with an active beam, it undergoes a reaction such as photo-cross-linking or photopolymerization and thereby changes in its chemical structure.

Examples of photosensitive monomers include compounds having an active carbon-carbon unsaturated double bond. Examples of functional groups include monofunctional and multifunctional compounds having a vinyl group, allyl group, acrylate group, methacrylate group, acrylamide group. In particular, organic compounds containing 10 to 80% by mass of a compound selected from multifunctional acrylate compounds and multifunctional methacrylate compounds are preferable, from the viewpoints of increasing cross-linking density in curing by photoreaction and enhancing pattern-forming properties. Specific examples include allylated cyclohexyl diacrylate, polyethylene glycol diacrylate, dipentaerythritol hexaacrylate, dipentaerythritol monohydroxy pentaacrylate, ditrimethylolpropane tetraacrylate, glycerol diacrylate, methoxized cyclohexyl diacrylate, neopentyl glycol diacrylate, propylene glycol diacrylate, polypropylene glycol diacrylate, triglycerol diacrylate, trimethylolpropane triacrylate, bisphenol A diacrylate, diacrylate of bisphenol A-ethylene oxide adduct, diacrylate of bisphenol A-propylene oxide adduct, 1,6-hexanediol diacrylate, tripropylene glycol diacrylate, 2-(2-ethoxyethoxy)ethyl acrylate, tetrahydrofurfuryl acrylate, lauryl acrylate, 2-phenoxyethyl acrylate, isodecyl acrylate, isooctyl acrylate, tridecyl acrylate, 1,3-butanediol diacrylate, 1,4-butanediol diacrylate, diethylene glycol diacrylate, tetraethylene glycol diacrylate, triethylene glycol diacrylate, the same compounds as above-mentioned with the proviso that all or a part of the acryl groups therein is/are replaced with a methacryl group(s), and the like.

As photosensitive oligomers and photosensitive polymers, oligomers and polymers that have an active carbon-carbon double bond are preferably used. Photosensitive oligomers and photosensitive polymers can be obtained by copolymerizing, for example: a carboxyl-group-containing monomer such as an acrylic acid, methacrylic acid, itaconic acid, crotonic acid, maleic acid, fumaric acid, vinylacetic acid, or acid anhydride thereof; and a monomer such as a methacrylic acid ester, acrylic acid ester, styrene, acrylonitrile, vinyl acetate, or 2-hydroxy acrylate. Examples of usable methods of incorporating an active carbon-carbon unsaturated double bond into an oligomer or a polymer include a method in which the mercapto group, amino group, hydroxyl group, or carboxyl group in an oligomer or a polymer is allowed to react with: an ethylenic unsaturated compound having a glycidyl group or an isocyanate group; acrylic acid chloride; methacrylic acid chloride; allyl chloride; or a carboxylic acid such as maleic acid.

The photosensitive organic compounds preferably contain a compound having a urethane group from the viewpoint of increasing the effect of suppressing the peeling of a conductive film. For example, the oligomers or polymers preferably contain a urethane-modified compound obtained by allowing an oligomer or polymer having a hydroxyl group as a side chain to react with a compound having an isocyanate group.

Such a photosensitive oligomer or polymer preferably has a weight-average molecular weight (Mw) in the range of 2000 to 200000 and a number average molecular weight (Mn) in the range of 1000 to 50000, more preferably an Mw in the range of 5000 to 100000 and an Mn in the range of 1000 to 30000. An Mw and an Mn in the above-mentioned ranges can afford good handling properties and uniform curability in photo-curing.

The photopolymerization initiator is selected in accordance with the light source used for photo-curing, and a photo-radical polymerization initiator, a photo-cation polymerization initiator, and the like can be used.

Examples of radical photopolymerization initiators include: diethoxy acetophenone; 2-hydroxy-2-methyl-1-phenylpropane-1-one; benzyldimethylketal; 1-(4-isopropylphenyl)-2-hydroxy-2-methylpropane-1-one; 4-(2-hydroxy ethoxy)phenyl-(2-hydroxy-2-propyl)ketone; 1-hydroxy cyclohexyl-phenyl ketone; 1-phenyl-1,2-propane dione-2-(o-ethoxy carbonyl)oxime; 2-methyl-[4-(methylthio)phenyl]-2-morpholino propane-1-one; 2-benzyl-2-dimethylamino-1-(4-morpholino phenyl)-butanone-1; benzoin; benzoin methyl ether; benzoin ethyl ether; benzoin isopropyl ether; benzoin isobutyl ether; benzophenone; o-benzoylbenzoic acid methyl; 4-phenylbenzophenone; 4,4-dichlorobenzophenone; hydroxy benzophenone; 4-benzoyl-4'-methyldiphenyl sulfide; alkylated benzophenone; 3,3',4,4'-tetra(t-butylperoxy carbonyl)benzophenone; 4-benzoyl-N,N-dimethyl-N-[2-(1-oxo-2-propenyloxy)ethyl]benzene methanaminium bromide; (4-benzoylbenzyl)trimethylammonium chloride; 2-hydroxy-3-(4-benzoylphenoxy)-N,N,N-trimethyl-1-propene aminium chloride monohydrate; 2-isopropylthioxanthone; 2,4-dimethyithioxanthone; 2,4-diethylthioxanthone; 2,4-dichlorothioxanthone; 2-hydroxy-3-(3,4-dimethyl-9-oxo-9H-thioxanthene-2-yloxy)-N,N,N-trimethyl-1-propanaminium chloride; 2,4,6-trimethylbenzoylphenyl phosphine oxide; 2,2'-bis(o-chlorophenyl)-4,5,4',5'-tetraphenyl-1,2-biimidazole; 10-butyl-2-chloroacridone; 2-ethyl anthraquinone; benzyl; 9,10-phenanthrene quinone; camphor quinone; methylphenylglyoxy ester; η5-cyclo pentadienyl-η6-cumenyl-iron (1+)-hexa fluoro phosphate (1-); diphenyl sulfide derivative; bis(η5-2,4-cyclo pentadiene-1-yl)-bis(2,6-difluoro-3-(1H-pyrrole-1-yl)-phenyl)titanium; 4,4-bis(dimethylamino)benzophenone; 4,4-bis(diethylamino)benzophenone; thioxanthone; 2-methylthioxanthone; 2-chlorothioxanthone; 4-benzoyl-4-methylphenyl ketone; dibenzyl ketone; fluorenone; 2,3-diethoxy acetophenone; 2,2-dimethoxy-2-phenyl-2-phenyl acetophenone; 2-hydroxy-2-methylpropiophenone; p-t-butyldichloroacetophenone; benzylmethoxy ethyl acetal; anthraquinone; 2-t-butyl anthraquinone; 2-aminoanthraquinone; β-chlor anthraquinone; anthrone; benzanthrone; dibenz suberone; methylene anthrone; 4-azido benzal acetophenone; 2,6-bis(p-azido benzylidene)cyclo hexane; 2,6-bis(p-azido benzylidene)-4-methylcyclohexanone; 2-phenyl-1,2-butadione-2-(o-methoxy carbonyl) oxime; 1,3-diphenylpropane trione-2-(o-ethoxy carbonyl) oxime; N-phenylglycine; tetrabutylammonium (+1)n-butyltriphenyl borate (1-); naphthalene sulfonyl chloride; quinoline sulfonyl chloride; N-phenylthioacridone; 4,4-azo bisisobutyronitrile; benzthiazole disulfide; triphenylphosphine; tetrabrominated carbon; tribromophenylsulfone; benzoyl peroxide; any combination of an optically reducible colorant such as eosin or methylene blue with a reducing agent such as ascorbic acid or triethanolamine; any complex of a cationic dye having an absorption band in near ultraviolet wavelengths and a borate anion; any combination of a silver halide sensitized with a near infrared colorant with a reducing agent; at least one of radical generators such as titanocene, iron arene complexes, organic peroxides, hexaaryl, biimidazole, N-phenylglycine and diaryliodonium salts; further, if necessary, sensitizing colorants such as 3-substituted coumalin, cyanine colorants, melocyanine colorants, thiazole colorants, and pyrylium colorants; and the like. Examples of photo-cation polymerization initiators include: iodonium salts, sulfonium salts, phosphate salts, antimonate salts, and the like. These may be used in combination of two or more kinds thereof.

Using a sensitizer together with a photopolymerization initiator can enhance sensitivity and extend a wavelength range effective for reaction. Specific examples of sensitizers include 2,3-bis(4-diethylaminobenzal)cyclopentanone, 2,6-bis(4-dimethylaminobenzal)cyclohexanone, 2,6-bis(4-dimethylaminobenzal)-4-methylcyclohexanone, 4,4-bis(dimethylamino)chalcone, 4,4-bis(diethylamino)chalcone, p-dimethylaminocinnamylidene indanone, p-dimethylaminobenzylidene indanone, 2-(p-dimethylaminophenylvinylene)isonaphthothiazole, 1,3-bis(4-dimethylaminophenylvinylene)isonaphthothiazole, 1,3-bis(4-dimethylaminobenzal)acetone, 1,3-carbonyl bis(4-diethylaminobenzal)acetone, 3,3-carbonyl bis(7-diethylaminocoumarin), triethanolamine, methyldiethanolamine, triisopropanolamine, N-phenyl-N-ethylethanolamine, N-phenylethanolamine, N-tolyldiethanolamine, 4-dimethylaminobenzoic acid methyl, 4-dimethylaminobenzoic acid ethyl, dimethylaminobenzoic acid isoamyl, diethylaminobenzoic acid isoamyl, benzoic acid (2-dimethylamino)ethyl, 4-dimethylaminobenzoic acid (n-butoxy)ethyl, 4-dimethylaminobenzoic acid 2-ethyl hexyl, 3-phenyl-5-benzoylthiotetrazole, 1-phenyl-5-ethoxycarbonylthiotetrazole, and the like. These may be used in combination of two or more kinds thereof.

(Method of Producing Conductive Film)

Methods of producing such a conductive film as above-mentioned are not limited to a particular one, examples of which methods include the following. First, a paste containing the electric conductor and the photosensitive organic compound is applied onto an insulated substrate using a known technique such as a spin coating method, a blade coating method, a slit die coating method, a screen printing method, a bar coater method, a casting method, a transfer printing method, an immersion and withdrawal method, an inkjet method, or the like, and dried using an oven, a hot plate, infrared ray, or the like to form a photosensitive conductive film.

The insulated substrate may be made of any material as long as at least its surface on which the conductive film is disposed has insulation properties. For example, smooth base materials such as: inorganic materials such as a silicon wafer, glass, sapphire, and alumina sintered materials; and organic materials such as polyethylene terephthalate, polyimide, polyester, polycarbonate, polysulfone, polyether sulfone, polyethylene, polyphenylene sulfide, and polyparaxylene are suitably used. Among others, those which have a glass transition temperature of 200° C. or less are preferable from the viewpoint of the flexibility of a base material, and polyethylene terephthalate in particular is preferable.

The drying is preferably carried out in the range of 50° C. to 300° C. for one minute to several hours. Next, the dried film is processed by photolithography into a pattern corresponding to a conductive film. As a light source used for light exposure, the i-line (365 nm), the h-line (405 nm), or the g-line (436 nm) of a mercury lamp is preferably used.

After light exposure, a developing solution is used to remove the unexposed parts, so that a desired pattern is obtained. As a developing solution in the case of alkali development, a preferable one is an aqueous solution of a compound such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, or hexamethylenediamine. In addition, these aqueous solutions may be used as developing solutions, optionally with the addition of one or more of: polar solvents such as N-methyl-2-pyrrolidone, N,N-dimethyl formamide, N,N-dimethyl acetoamide, dimethyl sulfoxide, and γ-butyrolactone; alcohols such as methanol, ethanol, and isopropanol; esters such as ethyl lactate and propylene glycol monomethyl ether acetate; ketones such as cyclopentanone, cyclohexanone, isobutyl ketone, and methylisobutyl ketone; and the like. In addition, these alkali aqueous solutions having a surfactant added thereto can be used as developing solutions. Examples of developing solutions that can be used in carrying out organic development include: a single polar solvent such as N-methyl-2-pyrrolidone, N-acetyl-2-pyrrolidone, N,N-dimethyl acetoamide, N,N-dimethyl formamide, dimethyl sulfoxide, or hexamethyl phosphortriamide; and a solution mixture of such a polar solvent in combination with methanol, ethanol, isopropyl alcohol, xylene, water, methyl carbitol, ethyl carbitol, or the like.

The development can be carried out by a method such as spraying a developing solution to a film surface to be coated, immersing a film in a developing solution, immersing a film under ultrasonication, or the like.

After development, rinse treatment may be carried out using water. Also here, rinse treatment may be carried out using water with the addition of an alcohol such as ethanol or isopropyl alcohol, or an ester such as ethyl lactate or propylene glycol monomethyl ether acetate.

Next, the coating film is cured in order to express conductivity. Examples of curing methods include: heat-curing with an oven, an inert oven, a hot plate, infrared ray, or the like; vacuum curing; curing with a xenon flash lamp; and the like. For heat-curing, curing temperatures are preferably in the range of 100 to 300° C., more preferably 100 to 200° C., further preferably 120° C. to 180° C. A heating temperature of 120° C. or more can increase the amount of volume shrinkage of a resinic photosensitive organic compound and reduce the specific resistivity.

The paste preferably contains an organic solvent. Using an organic solvent enables the viscosity adjustment of a paste and can enhance the surface smoothness of a coating film. The viscosity of a paste is preferably 10 to 100 Pa·s (a value measured using a Brookfield viscometer at 3 rpm). It is more preferably 10 to 50 Pa·s. A paste viscosity in the range of 10 to 100 Pa·s affords good coatability on irregularities. A paste viscosity of less than 10 Pa·s poses a problem in that it causes a coating defect due to the sedimentation of conductive powder or that it causes dribbling during coating, making the coating surface ununiform. In addition, a paste viscosity of more than 100 Pa·s causes defective coating to irregularities if any.

Examples of organic solvents include, but are not particularly limited to, methylethyl ketone, dioxane, acetone, cyclohexanone, cyclopentanone, isobutyl alcohol, isopropyl alcohol, tetrahydrofuran, γ-butyrolactone, bromobenzene, chlorobenzene, dibromobenzene, dichlorobenzene, bromobenzoic acid, chlorobenzoic acid and the like, diethylene glycol monoethyl ether acetate, diethylene glycol monobutyl ether, diethylene glycol monobutyl ether acetate, 2-methyl-2,4-pentanediol, 3-methyl-1,5-pentanediol, 2-ethyl-1,3-hexanediol, terpineol, 3-methyl-3-methoxybutanol, texanol, benzyl alcohol, dipropylene glycol monoethyl ether, tripropylene glycol monomethyl ether, propylene glycol monomethyl ether acetate, and the like. These may be used in mixture of two or more kinds thereof.

The paste is produced using a disperser, a kneading machine, or the like. Specific examples thereof include, but are not limited to, a three roll mill, a ball mill, a sun-and-planet ball mill, and the like.

(Method of Producing Capacitor)

Figure 7:
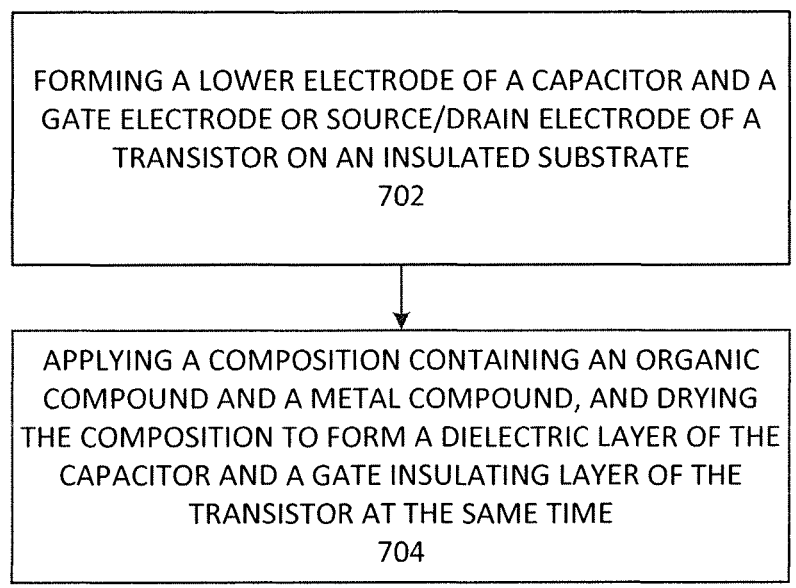
FIG. 7 is a flow diagram depicting a method for producing a circuit in accordance with an embodiment of the present disclosure.

Methods of producing capacitors are not limited to a particular one, and includes the following steps.
(1) the step of forming, on an insulated substrate, a photosensitive conductive film using a conductive paste containing an electric conductor and a photosensitive organic compound (See FIG. 7, Step 702);
(2) the step of processing the photosensitive conductive film into a pattern corresponding to a conductive film of a capacitor by photolithography (See FIG. 7, Step 702); and
(3) the step of applying a composition containing an organic compound containing a bond between a silicon atom and a carbon atom, and drying the composition to form a dielectric layer (See FIG. 7, Step 704).

Examples of the step (1) include a method in which a conductive paste containing an electric conductor and a photosensitive organic compound is applied onto an insulated substrate using a known technique such as a spin coating method, a blade coating method, a slit die coating method, a screen printing method, a bar coater method, a casting method, a transfer printing method, an immersion and withdrawal method, an inkjet method, or the like, and dried using an oven, a hot plate, infrared ray, or the like to form a photosensitive conductive film.

Examples of the step (2) include a method in which the dried film is processed into a pattern corresponding to a lower electrode of a capacitor by the photolithography above-mentioned in the method of producing a conductive film. In this, allowing the conductive paste to contain a photosensitive organic compound facilitates the micro patterning of the conductive film and enables the production of a micro capacitor.

Examples of the step (3) include a method in which an organic compound containing a bond between a silicon atom and a carbon atom is applied onto the lower electrode of a capacitor and dried to form a dielectric layer, as in the above-mentioned method of producing a dielectric layer. Then the formed dielectric layer may be processed into any pattern by a known photolithography method.

Alternatively, in an example, an organic compound containing a bond between a silicon atom and a carbon atom may be applied in any pattern onto the lower electrode of a capacitor by a coating method such as a transfer printing method or an inkjet method, and dried to form a dielectric layer.

Next, an upper electrode of a capacitor is produced on the upper side of the dielectric layer by a method capable of generating electric conduction, such as resistance heating evaporation, electron beam, sputtering, plating, CVD, ion plating coating, inkjet, or printing, whereby a capacitor can be produced.

In this regard, the upper electrode of a capacitor is preferably produced in the same method as the lower electrode from the viewpoint that adhesiveness to the dielectric layer is enhanced by an increase in the flexibility of the conductive film.

The characteristics of thus produced capacitors can be evaluated, for example, by measuring the capacitance of a capacitor using a known method or by measuring the adhesion between the dielectric layer and the conductive film. A capacitor having large capacitance and strong adhesiveness is regarded as a capacitor having good characteristics.

The capacitor according to the present invention keeps leak current suppressed and hence can be driven at up to a high voltage. In other words, the capacitor according to the present invention exhibits a characteristic of high operational electric strength.

<Circuit>

Next, a circuit having the capacitor according to the present invention will be described. This circuit includes at least the above-mentioned capacitor and a transistor on the same substrate, and may further include a diode, a resistor, and a memory device, if necessary. The transistor, diode, resistor, memory device, and the like may be any of those which are generally used, and materials and shapes used therefor are not limited to particular ones. Among others, the transistor is preferably a field-effect transistor having a gate insulating layer, a gate electrode, a semiconductor layer, a source electrode, and a drain electrode on an insulated substrate. Further, the dielectric layer of a capacitor is preferably made of the same material as the gate insulating layer of a transistor. This is because a fewer kinds of material is required and because producing the dielectric layer of a capacitor and the gate insulating layer of a transistor in the same step can reduce the number of production steps and lower cost.

That the dielectric layer of a capacitor is made of the same material as the gate insulating layer of a transistor means that the dielectric layer of a capacitor and the gate insulating layer of a transistor contain elements of which the element having the highest mole fraction is the same. The kinds and content ratios of elements can be identified by elemental analysis such as X-ray photoelectron spectroscopy (XPS) and secondary ion mass spectrometry (SIMS).

When the dielectric layer of a capacitor and the gate insulating layer of a transistor are produced in the same step, the connecting portion between the dielectric layer of the capacitor and the gate insulating layer of the transistor is formed in a continuous phase. These are preferably formed in a continuous phase from the viewpoint of manufacturing cost reduction. That the dielectric layer of a capacitor and the gate insulating layer of a transistor are in a continuous phase means that their patterns are integrated to have no connection interface existing at their connecting portion. The dielectric layer of a capacitor and the gate insulating layer of a transistor being in a continuous phase at their connecting portion can be confirmed by observing the cross-section of the connecting portion using a scanning electron microscope (SEM), a transmission electron microscope (TEM), and the like.

<Radio Communication Device>

Next, a radio communication device having the capacitor according to the present invention will be described. This radio communication device refers to a device, such as an RFID, in which an RFID tag receives carrier waves transmitted from an antenna mounted in a reader/writer, thereby carrying out electrical communication.

Specifically, in the operation, an antenna of an RFID tag receives a radio signal transmitted from an antenna mounted in a reader/writer, for example. The RFID tag operates in accordance with a command that it has received. Then, a resulting response in accordance with the command is transmitted as a radio signal from the antenna of the RFID tag to the antenna of the reader/writer. In this regard, an operation in accordance with a command is carried out at least by a known demodulation circuit, control logic circuit, or modulation circuit.

As shown in FIG. 6, the radio communication device 602 according to the present invention has at least the above-mentioned capacitor 604, a transistor 606, and an antenna 608. Examples of more specific configurations include a radio communication device in which a terminal into which an alternating-current signal is inputted is electrically connected with one end of an output terminal, the other end of which output terminal is electrically connected with a demodulation circuit containing the above-mentioned capacitor and transistor, a control logic circuit, and a modulation circuit, in which the alternating-current signal is a signal that the antenna has received.

The input terminal, output terminal, antenna, and transistor may be any of those which are generally used, and materials and shapes used therefor are not limited to particular ones. Materials for electrically connecting them may be any of conductive materials which can generally be used. Connecting methods may be any of those which can afford electrical conduction, and the width and thickness of the connecting portion may be anything.

EXAMPLES

Below, the present invention will be described more specifically with reference to Examples. However, the present invention is not to be limited to the following Examples. Each evaluation method in Examples will be described in the following (1) to (3).

(1) Weight-Average Molecular Weight Measurement

The weight-average molecular weight of a polymer was determined in terms of polystyrene using GPC (GEL PERMEATION CHROMATOGRAPHY: HLC-8220GPC made by Tosoh Corporation) (developing solvent: tetrahydrofuran, developing rate: 0.4 ml/min.) after filtering a sample through a membrane filter having a pore size of 0.45 µm.

(2) Elemental Analysis

The element information and element content of a film to be measured were analyzed using X-ray photoelectron spectroscopy (Quantera SXM made by ULVAC-PHI, Inc.) that irradiates the film with soft X-rays in ultra-high vacuum and detects photoelectrons emitted from the surface. From the analyzed element content ratios, the weight of each element was calculated to find the weight of metal atoms contained with respect to the total of silicon atoms and carbon atoms as 100 parts by weight.

(3) Evaluation of Adhesiveness Between Dielectric Layer and Conductive Film of Capacitor It will be described with reference to FIG. 5. A substrate 101 having a capacitor formed thereon was used such that a metal column 100 having a diameter of 30 mm was fixed on the central part of the surface with the capacitor formed thereon; was arranged along the column such that the wrap angle to the column was 0° (the sample was in a state of a flat surface) (see FIG. 5A); and underwent flexing actions such that the wrap angle to the column was in the range up to 180° (in a state of being flexed back around the column) (see FIG. 5B). The pattern of the capacitor was observed with a light microscope before and after the flexing actions, followed by finding any peeling and breaking, and evaluated for a flex resistance on the following criteria.

A (very good): no peeling nor breaking found even on repeating a flexing action 500 times B (good): no peeling nor breaking found even on repeating a flexing action 300 times C (acceptable): no peeling nor breaking found even on repeating a flexing action 100 times D (not acceptable): some peeling and/or breaking found on repeating a flexing action less than 100 times

Synthesis Example 1: Compound P1 (Photosensitive Polymer)

Copolymerization ratio (by weight): ethyl acrylate (hereinafter "EA")/2-ethylhexyl methacrylate (hereinafter "2-EHMA")/styrene (hereinafter "St")/glycidyl methacrylate (hereinafter "GMA")/acrylic acid (hereinafter "AA")= 20/40/20/5/15

Into a reactor under a nitrogen atmosphere, 150 g of diethylene glycol monoethyl ether acetate (hereinafter "DMEA") was fed, and heated to 80° C. using an oil bath. To this, a mixture of 20 g of EA, 40 g of 2-EHMA, 20 g of St, 15 g of AA, 0.8 g of 2,2'-azobisisobutyronitrile, and 10 g of DMEA was added dropwise over one hour. After the dropping, the mixture was allowed to react for polymerization for another 6 hours. Then, 1 g of hydroquinone monomethyl ether was added to the mixture, and the polymerization reaction was terminated. Subsequently, a mixture of 5 g of GMA, 1 g of triethylbenzylammonium chloride, and 10 g of DMEA was added dropwise over 0.5 hours. After the dropping, the mixture was left for addition reaction for another 2 hours. The resulting reaction solution was purified with methanol to remove unreacted impurities, and dried in vacuo for further 24 hours to obtain a compound P1.

Synthesis Example 2: Compound P2 (Photosensitive Polymer)

Copolymerization ratio (by weight): bifunctional epoxy acrylate monomer (Epoxy Ester 3002A made by Kyoeisha Chemical Co., Ltd.)/bifunctional epoxy acrylate monomer (Epoxy Ester 70PA made by Kyoeisha Chemical Co., Ltd.)/GMA/St/AA=20/40/5/20/15

Into a reactor under a nitrogen atmosphere, 150 g of diethylene glycol monoethyl ether acetate (hereinafter "DMEA") was fed, and heated to 80° C. using an oil bath. To this, a mixture of 20 g of Epoxy Ester 3002A, 40 g of Epoxy Ester 70PA, 20 g of St, 15 g of AA, 0.8 g of 2,2'-azobisisobutyronitrile, and 10 g of DMEA was added dropwise over one hour. After the dropping, the mixture was allowed to react for polymerization for another 6 hours. Then, 1 g of hydroquinone monomethyl ether was added to the mixture, and the polymerization reaction was terminated. Subsequently, a mixture of 5 g of GMA, 1 g of triethylbenzylammonium chloride, and 10 g of DMEA was added dropwise over 0.5 hours. After the dropping, the mixture was left for addition reaction for another 2 hours. The resulting reaction solution was purified with methanol to remove unreacted impurities, and dried in vacuo for further 24 hours to obtain a compound P2.

Synthesis Example 3: Compound P3 (Photosensitive Polymer (Urethane-Modified Compound of Compound P2))

Into a reactor under a nitrogen atmosphere, 100 g of diethylene glycol monoethyl ether acetate (hereinafter "DMEA") was fed, and heated to 80° C. using an oil bath. To this, a mixture of 10 g of the photosensitive component P2, 3.5 g of n-hexylisocyanate, and 10 g of DMEA was added dropwise over one hour. After the dropping, the mixture was allowed to react for another 3 hours. The resulting reaction solution was purified with methanol to remove unreacted impurities, and dried in vacuo for further 24 hours to obtain a compound P3 having a urethane bond.

Preparation Example 1: Conductive Paste A

Into a 100 ml clean bottle, 16 g of the compound P1, 4 g of the compound P3, 4 g of a photopolymerization initiator OXE-01 (made by BASF Japan Ltd.), 0.6 g of an acid generator SI-110 (made by Sanshin Chemical Industry Co., Ltd.), and 10 g of γ-butyrolactone (made by Mitsubishi Gas Chemical Company, Inc.) were loaded, and mixed using a planetary centrifugal mixer "Awatori Rentaro" (registered trademark) (ARE-310; made by Thinky Corporation) to obtain 46.6 g of a photosensitive resin solution (having a solid content of 78.5% by weight). The obtained photosensitive resin solution (8.0 g) and 42.0 g of Ag particles having an average particle size of 2 μm were mixed together, and the mixture was kneaded using a three roll mill "Exakt M-50" (which is a tradename and made by EXAKT Technologies, Inc.) to obtain 50 g of a photosensitive conductive paste A.

Preparation Example 2: Conductive Paste B

A photosensitive conductive paste B was obtained in the same manner as in Preparation Example 1 except that Ag particles having an average particle size 0.2 μm were used.

Table 1 shows the compositions of the conductive pastes obtained in Preparation Examples 1 and 2.

TABLE 1

| | Photosensitive Paste | Polymerizable Component | Photopolymerization Initiator | Conductive Material (Average Particle Size) | Acid Generator | Solvent |
|---|---|---|---|---|---|---|
| Preparation Example 1 | A | P1, P3 | OXE-01 | Ag (2 μm) | SI-110 | γ-butyrolactone |
| Preparation Example 2 | B | P1, P3 | OXE-01 | Ag (0.2 μm) | SI-110 | γ-butyrolactone |

Composition Production Example 1: Dielectric Material Solution A

Methyltrimethoxy silane (61.29 g, 0.45 mol), 2-(3,4-epoxycyclohexyl)ethyltrimethoxy silane (12.31 g, 0.05 mol), and phenyltrimethoxy silane (99.15 g, 0.5 mol) were dissolved in 203.36 g of propylene glycol monobutyl ether (the boiling point: 170° C.), and to this, 54.90 g of water and 0.864 g of phosphoric acid were added with stirring. The obtained solution was heated at a bath temperature of 105° C. for 2 hours, and the inside temperature was raised to 90° C. to distill off a component mainly containing methanol generated as a byproduct. The solution was then heated at a bath temperature of 130° C. for 2.0 hours, the inside temperature was raised to 118° C. to distill off a component mainly containing water and propylene glycol monobutyl ether, and then the solution was cooled to room temperature to obtain a polysiloxane solution A having a solid content of 26.0% by weight. The obtained polysiloxane had a weight-average molecular weight of 6000.

The obtained polysiloxane solution A (10 g) was weighed out, mixed with 0.13 g of aluminum bis(ethyl acetoacetate) mono(2,4-pentanedionate) (the tradename "Alumichelate D"; made by Kawaken Fine Chemicals Co., Ltd.; hereinafter referred to as "Alumichelate D") and 54.4 g of propylene glycol monoethyl ether acetate (hereinafter referred to as "PGMEA"), and stirred at room temperature for 2 hours to obtain a dielectric material solution A. The content of the above-mentioned polymer in this solution was 2000 parts by weight with respect to 100 parts by weight of Alumichelate D. The dielectric material solution A was stored at room temperature in the air, and after one month, it had no observed precipitate and was found to be stable.

Composition Production Example 2: Dielectric Material Solution B

A dielectric material solution B was obtained in the same manner as the dielectric material solution A except that 2.5 g of the polysiloxane solution A, 13 g of indium tris(2,4-pentanedionate) (made by Wako Pure Chemical Industries, Ltd.) in place of Alumichelate D, and 49.8 g of PGMEA were used. The content of the above-mentioned polymer in this solution was 5 parts by weight with respect to 100 parts by weight of indium tris(2,4-pentanedionate).

Composition Production Example 3: Dielectric Material Solution C

A dielectric material solution C was obtained in the same manner as the dielectric material solution A except that 13 g of Alumichelate D and 42 g of PGMEA were used. The content of the above-mentioned polymer in this solution was 20 parts by weight with respect to 100 parts by weight of Alumichelate D.

Composition Production Example 4: Dielectric Material Solution D

A dielectric material solution D was obtained in the same manner as the dielectric material solution A except that 2.5 g of the polysiloxane solution A, 13 g of Alumichelate D, and 49.5 g of PGMEA were used. The content of the above-mentioned polymer in this solution was 5 parts by weight with respect to 100 parts by weight of Alumichelate D.

Composition Production Example 5: Dielectric Material Solution E

A dielectric material solution E was obtained in the same manner as the dielectric material solution A except that 5.2 g of titanium tetra(2,4-pentanedionate) (the tradename "ORGATIX TC-401"; made by Matsumoto Fine Chemical Co., Ltd.) in place of Alumichelate D and 49.8 g of PEG-MEA were used. The content of the above-mentioned polymer in this solution was 50 parts by weight with respect to 100 parts by weight of zirconium tetra(2,4-pentanedionate).

Composition Production Example 6: Dielectric Material Solution F

A dielectric material solution F was obtained in the same manner as the dielectric material solution E except that 5.2 g of indium tris(2,4-pentanedionate) (made by Wako Pure Chemical Industries, Ltd.) was used in place of titanium tetra(2,4-pentanedionate). The content of the above-mentioned polymer in this solution was 50 parts by weight with respect to 100 parts by weight of indium tris(2,4-pentanedionate).

Composition Production Example 7: Dielectric Material Solution G

A dielectric material solution G was obtained in the same manner as the dielectric material solution E except that 5.2 g of Alumichelate D was used in place of titanium tetra(2,4-pentanedionate). The content of the above-mentioned polymer in this solution was 50 parts by weight with respect to 100 parts by weight of Alumichelate D.

Composition Production Example 8: Dielectric Material Solution H

A dielectric material solution H was obtained in the same manner as the dielectric material solution A except that 13 g of Alumichelate D and 49.5 g of PGMEA were used. The content of the above-mentioned polymer in this solution was 87 parts by weight with respect to 100 parts by weight of Alumichelate D.

Composition Production Example 9: Dielectric Material Solution I

Methyltrimethoxy silane (66.7 g, 0.49 mol), γ-glycidoxypropyltrimethoxy silane (2.36 g, 0.01 mol), and phenyltrimethoxy silane (99.2 g, 0.5 mol) were dissolved in 471.1 g of propylene glycol monomethyl ether (the boiling point: 121° C.), and to this, 54.2 g of water and 0.85 g of phosphoric acid were added with stirring. The obtained solution was heated at a bath temperature of 105° C. for 2 hours, and the inside temperature was raised to 90° C. to distill off a component mainly containing methanol generated as a byproduct. The solution was then heated at a bath temperature of 115° C. for 4 hours, the inside temperature was raised to 118° C. to distill off a component mainly containing water and propylene glycol monomethyl ether, and then the solution was cooled to room temperature to obtain a polysiloxane solution B having a solid content of 40.0% by weight. The obtained polysiloxane had a weight-average molecular weight of 9000.

The obtained polysiloxane solution B (10 g) was weighed out, mixed with 13 g of Alumichelate D and 52.5 g of propylene glycol mono-t-butyl ether (boiling point: 143° C.), and stirred at room temperature for 2 hours to obtain a dielectric material solution I. The content of the above-mentioned polymer in this solution was 20 parts by weight with respect to 100 parts by weight of Alumichelate D.

Composition Production Example 10: Dielectric Material Solution J

The below-mentioned SPCR-69X (which is a tradename and made by Showa Denko K.K.; the weight-average molecular weight: 15000) in an amount of 2.6 g as a polymer, 13 g of Alumichelate D, and 49.4 g of PGMEA were mixed and stirred at room temperature for 2 hours to obtain a dielectric material solution J.

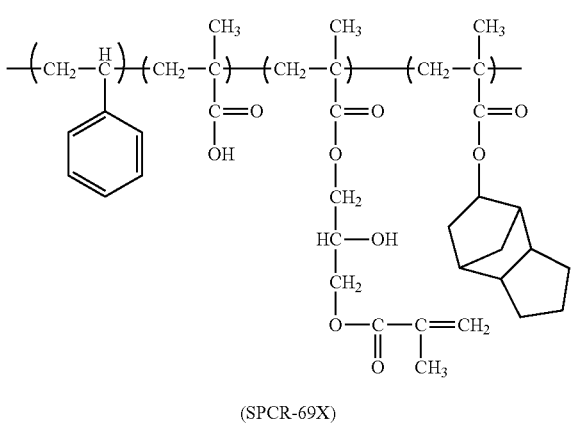

(SPCR-69X)

Composition Production Example 11: Dielectric Material Solution K

A dielectric material solution K was produced in the same manner as the dielectric material solution C except that Ethyl Silicate 48 (which is a tradename and made by Colcoat Co., Ltd.; the weight-average molecular weight: 1500) was used in place of the polysiloxane solution A.

Example 1

A capacitor such as shown in FIG. 1 was produced. The conductive paste A was applied to a PET film having a film thickness of 50 μm by screen printing, and prebaked in a drying oven at 100° C. for 10 minutes. The coated film was then exposed to light using an aligner "PEM-8M" (which is a tradename and made by Union Optical Co., LTD.), immersed in a 0.5% $Na_2CO_3$ solution for development for 30 seconds, rinsed with ultrapure water, and cured in a drying oven at 140° C. for 30 minutes to form a conductive film 1. The conductive film 1 was made to have an area of 0.01 mm². Next, the PET film with the conductive film 1 formed thereon was spin-coated with the dielectric material solution A (2000 rpm×20 seconds); the coated film was heat-treated at 120° C. for 5 minutes; the film was then spin-coated with the dielectric material solution A again (2000 rpm×20 seconds); and the coated film was then heat-treated under a nitrogen stream at 200° C. for 30 minutes to form a dielectric layer having a film thickness of 0.2 μm. Next, the layer was spin-coated with a photoresist (the tradename "LC100-10 cP"; made by Rohm and Haas Japan K.K.) (1000 rpm×20 seconds), and dried by heating at 100° C. for 10 minutes. The produced photoresist film was exposed to light for patterning via a mask using the aligner "PEM-8M", subjected to shower development for 70 seconds with ELM-D (which is a tradename and made by Mitsubishi Gas Chemical Company, Inc.) which is a 2.38% by weight tetramethylammonium hydroxide aqueous solution, and rinsed with ultrapure water. The film was then etched with SEA-1 (which is a tradename and made by Kanto Chemical Co., Inc.) for one minute, and cleaned with water for 30 seconds. The film was immersed in AZ Remover 100 (which is a tradename and made by AZ Electronic Materials (Japan) K.K.) for 5 minutes to peel the resist off, forming a dielectric layer 3. Then, the layer was coated with the conductive paste A by screen printing, and prebaked in a drying oven at 100° C. for 10 minutes. The coated film was then exposed to light using the aligner "PEM-8M", immersed in a 0.5% $Na_2CO_3$ solution for development for 30 seconds, rinsed with ultrapure water, and cured in a drying oven at 140° C. for 30 minutes to form a conductive film 2.

Next, the capacitor was measured for ESR and capacitance using an LCR meter Model 879B (made by B&K Precision Corp.). In addition, the capacitor was measured for leak current (5 minutes after 25 V was applied) using a semiconductor characterization system Model 4200-SCS (made by Keithley Instruments Co., Ltd.). Furthermore, the capacitor was evaluated for adhesiveness between the dielectric layer and conductive film of the capacitor by means of flexing. At this time, the dielectric layer was further analyzed by X-ray photoelectron spectroscopy, and found to have 2.5 parts by weight of aluminum atoms with respect to 100 parts by weight of the total of carbon atoms and silicon atoms.

Examples 2 to 11

Capacitors was produced on the conditions shown in Table 2 in the same manner as in Example 1. The obtained capacitors were evaluated for ESR, capacitance, leak current, and adhesiveness between the dielectric layer and the conductive film.

Example 12

A capacitor was produced in the same manner as in Example 1 except that the PET film with the conductive film 1 formed thereon was spin-coated with the dielectric material solution D (500 rpm×20 seconds); the coated film was heat-treated at 120° C. for 5 minutes; the film was then spin-coated with the dielectric material solution D again (500 rpm×20 seconds); and the coated film was then heat-treated under a nitrogen stream at 200° C. for 30 minutes to form a dielectric layer having a film thickness of 4.1 μm. The obtained capacitor was evaluated for ESR, capacitance, leak current, and adhesiveness between the dielectric layer and the conductive film.

Example 13

On a PET film having a film thickness of 50 μm, a 5 nm chromium layer and a 150 nm silver layer were evaporated under vacuum via mask by means of resistance heating to form a conductive film 1. Then, a dielectric layer 3 and a conductive film 2 were formed in the same manner as in Example 4 to produce a capacitor. The obtained capacitor was evaluated for ESR, capacitance, leak current, and adhesiveness between the dielectric layer and the conductive film.

Comparative Example 1

On a PET film having a film thickness of 50 μm, a 5 nm chromium layer and a 150 nm silver layer were evaporated under vacuum via mask by means of resistance heating to form a conductive film 1. Then, a dielectric layer 3 was formed in the same manner as in Example 3. Then, a conductive film 2 was again formed by evaporating a 150 nm silver layer under vacuum via mask by means of resistance heating to produce a capacitor. The obtained capacitor was evaluated for ESR, capacitance, leak current, and adhesiveness between the dielectric layer and the conductive film.

Comparative Example 2

A capacitor was produced on the conditions shown in Table 2 in the same manner as in Example 1. The obtained capacitor was evaluated for ESR, capacitance, leak current, and adhesiveness between the dielectric layer and the conductive film.

The compositions of the dielectric material solutions and the constitutions of the capacitors used in Examples and Comparative Examples are shown in Table 2, and the evaluation results are shown in Table 3.

TABLE 2

| | Dielectric Material Solution | Metal Compound | Organic Compound | Film Thickness of Dielectric Layer [μm] | Conductive Film 1 | Conductive Film 2 |
|---|---|---|---|---|---|---|
| Example 1 | Dielectric Material Solution A | Alumichelate D | Polysiloxane A | 0.2 | Conductive Paste A | Conductive Paste A |
| Example 2 | Dielectric Material Solution B | Indium tris(2,4-pentanedionate) | Polysiloxane A | 1.2 | Conductive Paste A | Conductive Paste A |
| Example 3 | Dielectric Material Solution C | Alumichelate D | Polysiloxane A | 0.3 | Conductive Paste A | Conductive Paste A |
| Example 4 | Dielectric Material Solution D | Alumichelate D | Polysiloxane A | 0.4 | Conductive Paste A | Conductive Paste A |
| Example 5 | Dielectric Material Solution E | Titanium tetra(2,4-pentanedionate) | Polysiloxane A | 0.3 | Conductive Paste A | Conductive Paste A |
| Example 6 | Dielectric Material Solution F | Indium tris(2,4-pentanedionate) | Polysiloxane A | 1.0 | Conductive Paste A | Conductive Paste A |
| Example 7 | Dielectric Material Solution G | Alumichelate D | Polysiloxane A | 0.4 | Conductive Paste B | Conductive Paste B |
| Example 8 | Dielectric Material Solution H | Alumichelate D | Polysiloxane A | 0.3 | Conductive Paste A | Conductive Paste A |
| Example 9 | Dielectric Material Solution I | Alumichelate D | Polysiloxane B | 0.4 | Conductive Paste A | Conductive Paste A |
| Example 10 | Dielectric Material Solution J | Alumichelate D | SPCR-69X | 0.2 | Conductive Paste A | Conductive Paste A |
| Example 11 | Dielectric Material Solution K | Alumichelate D | Ethyl Silicate | 0.2 | Conductive Paste A | Conductive Paste A |
| Example 12 | Dielectric Material Solution D | Alumichelate D | Polysiloxane A | 4.0 | Conductive Paste A | Conductive Paste A |
| Example 13 | Dielectric Material Solution D | Alumichelate D | Polysiloxane A | 0.4 | Ag evaporated | Conductive Paste A |
| Comparative Example 1 | Dielectric Material Solution C | Alumichelate D | Polysiloxane A | 0.4 | Ag evaporated | Ag evaporated |
| Comparative Example 2 | Polysiloxane B | — | Polysiloxane B | 1.9 | Conductive Paste A | Conductive Paste A |

TABLE 3

| | Dielectric Material Solution | Weight of Metal Atoms with respect to 100 parts by weight of Carbon Atoms and Silicon Atoms | Capacitance [μF] | ESR [Ω] | Leak Current [μA] | Adhesiveness |
|---|---|---|---|---|---|---|
| Example 1 | Dielectric Material Solution A | 2.5 | 0.89 | 4.1 | 11.0 | A |
| Example 2 | Dielectric Material Solution B | 154 | 0.30 | 5.8 | 3.2 | A |
| Example 3 | Dielectric Material Solution C | 21 | 1.56 | 0.7 | 2.4 | A |
| Example 4 | Dielectric Material Solution D | 41 | 1.22 | 1.1 | 2.1 | A |
| Example 5 | Dielectric Material Solution E | 22 | 0.74 | 5.1 | 6.6 | A |
| Example 6 | Dielectric Material Solution F | 53 | 0.35 | 5.5 | 3.8 | A |
| Example 7 | Dielectric Material Solution G | 14 | 1.06 | 2.8 | 4.9 | B |
| Example 8 | Dielectric Material Solution H | 11 | 1.12 | 2.4 | 5.1 | A |
| Example 9 | Dielectric Material Solution I | 21 | 1.34 | 1.3 | 3.5 | A |
| Example 10 | Dielectric Material Solution J | 21 | 0.08 | 6.8 | 6.5 | B |
| Example 11 | Dielectric Material Solution K | 21 | 0.09 | 7.1 | 5.8 | B |
| Example 12 | Dielectric Material Solution D | 41 | 0.12 | 3.8 | 0.9 | A |
| Example 13 | Dielectric Material Solution D | 41 | 0.66 | 3.4 | 4.8 | C |
| Comparative Example 1 | Dielectric Material Solution C | 21 | 0.007 | 10.8 | 3.7 | D |
| Comparative Example 2 | Polysiloxane B | — | 0.009 | 11.5 | 9.8 | A |

REFERENCE SIGNS LIST

1 Conductive Film
2 Conductive Film
3 Dielectric Layer
10 Substrate
100 Metal Column
101 Antenna Substrate

The invention claimed is:

1. A capacitor comprising at least one pair of conductive films and a dielectric layer provided between the pair of conductive films, wherein the dielectric layer contains an organic compound and a metal compound, and wherein at least one of the pair of conductive films contains a metal and an organic compound, and wherein the organic compound in the dielectric layer contains a silicon-carbon bonding.

2. The capacitor according to claim 1, wherein the metal compound in the dielectric layer contains a bond between a metal atom and an oxygen atom.

3. The capacitor according to claim 1, wherein the dielectric layer contains 10 to 180 parts by weight of metal atoms with respect to 100 parts by weight of the total of carbon atoms and silicon atoms.

4. The capacitor according to claim 2, wherein the metal atom in the metal compound of the dielectric layer is aluminum.

5. The capacitor according to claim 1, wherein the dielectric layer has a film thickness of 0.1 μm to 5 μm.

6. The capacitor according to claim 1, wherein the organic compound in the at least one of the pair of conductive films has a urethane group.

7. A circuit comprising at least the capacitor according to claim 1 and a transistor.

8. The circuit according to claim 7, wherein the transistor comprises a gate insulating layer, and the gate insulating layer and the dielectric layer are made of a same material.

9. A method of producing a capacitor, comprising at least the following steps:
  (1) the step of forming, on an insulated substrate, a photosensitive conductive film using a conductive paste containing an electric conductor and a photosensitive organic compound;
  (2) the step of processing the photosensitive conductive film into a pattern corresponding to a conductive film of the capacitor by photolithography; and
  (3) the step of applying a composition containing an organic compound and a metal compound, and drying the composition to form a dielectric layer;
  wherein in the organic compound of the dielectric layer, the composition contains a silicon-carbon bonding.

10. The method of producing a capacitor according to claim 9, wherein in the dielectric layer, the composition contains a polymer having a weight-average molecular weight of 1000 or more.

11. The method of producing a capacitor according to claim 9, wherein in the dielectric layer, the composition further contains a metal chelate compound represented by a general formula (1):

$$R^1_x M(OR^2)_{y-x} \tag{1}$$

wherein $R^1$ represents a monovalent bidentate ligand, and when a plurality of $R^1$s are present, each of the plurality of the $R^1$s may be the same or different; $R^2$ represents a hydrogen atom, an alkyl group, an acyl group, or an aryl group, and when a plurality of $R^2$s are present, each of the plurality of the $R^2$s may be the same or different; M represents a y-valent metal atom; y is 1 to 6; and x represents an integer from 1 to y.

12. The method of producing a capacitor according to claim 11, wherein in the dielectric layer, the composition contains 5 to 90 parts by weight of a polymer having a weight-average molecular weight of 1000 or more with respect to 100 parts by weight of the metal chelate compound represented by the general formula (1).

13. A method of producing a circuit, comprising at least the following steps:
  (1) the step of forming a lower electrode of a capacitor and a gate electrode or source/drain electrode of a transistor on an insulated substrate; and
  (2) the step of applying a composition containing an organic compound and a metal compound, and drying the composition to form a dielectric layer of the capacitor and a gate insulating layer of the transistor at the same time,
  wherein in the organic compound of the dielectric layer, the composition contains a silicon-carbon bonding.

14. A radio communication device comprising at least the capacitor according to claim 1, a transistor, and an antenna pattern.

* * * * *